(12) United States Patent
Kung et al.

(10) Patent No.: US 12,526,983 B2
(45) Date of Patent: Jan. 13, 2026

(54) SEMICONDUCTOR STRUCTURE AND METHOD OF MANUFACTURING THE SAME

(71) Applicant: NANYA TECHNOLOGY CORPORATION, New Taipei (TW)

(72) Inventors: Yao-Hsiung Kung, Taoyuan (TW); Yu-Li Wu, New Taipei (TW); Shao-En Yeh, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 426 days.

(21) Appl. No.: 18/133,056

(22) Filed: Apr. 11, 2023

(65) Prior Publication Data

US 2024/0349485 A1   Oct. 17, 2024

(51) Int. Cl.
*H10B 12/00* (2023.01)

(52) U.S. Cl.
CPC ............. *H10B 12/33* (2023.02); *H10B 12/05* (2023.02); *H10B 12/488* (2023.02)

(58) Field of Classification Search
CPC ...... H10B 12/036; H10B 12/30; H10B 12/33; H10B 12/36; H10B 12/39; H10B 12/395; H10B 12/488; H10B 12/05; H10B 12/02
See application file for complete search history.

(56) References Cited

U.S. PATENT DOCUMENTS

| | | | |
|---|---|---|---|
| 9,842,839 B1 * | 12/2017 | Sills | ........................ H10B 12/05 |
| 10,629,675 B1 | 4/2020 | Nishikawa et al. | |
| 11,404,421 B2 * | 8/2022 | Inaba | ..................... H10B 12/30 |
| 2019/0244970 A1 | 8/2019 | Jung et al. | |
| 2020/0388619 A1 * | 12/2020 | Sukekawa | ........... H01L 21/0217 |
| 2021/0104538 A1 | 4/2021 | Lee et al. | |
| 2021/0159113 A1 | 5/2021 | Choi et al. | |
| 2022/0028894 A1 | 1/2022 | Yang et al. | |
| 2022/0068925 A1 * | 3/2022 | Kawai | ..................... H10D 99/00 |
| 2023/0045420 A1 | 2/2023 | Wang et al. | |
| 2023/0422484 A1 * | 12/2023 | Kikuchi | ............. H10D 30/6728 |

FOREIGN PATENT DOCUMENTS

| | | |
|---|---|---|
| CN | 103383935 A | 11/2013 |
| CN | 112614847 A | 4/2021 |
| TW | 201543727 A | 11/2015 |

(Continued)

OTHER PUBLICATIONS

Office Action and and the search report mailed on Oct. 25, 2024 related to Taiwanese Application No. 113112310.

(Continued)

*Primary Examiner* — Eduardo A Rodela
(74) *Attorney, Agent, or Firm* — Xuan Zhang

(57) ABSTRACT

The present disclosure provides a semiconductor structure and a method of manufacturing a semiconductor structure. The semiconductor structure includes: a data storage unit in a first dielectric layer; a word line disposed over the data storage unit; an array of conductive pads disposed over the word line; a hard mask layer disposed over the array of conductive pads; and a second dielectric layer laterally surrounding the hard mask layer and the array of conductive pads, the second dielectric layer is leveled with the hard mask layer.

9 Claims, 39 Drawing Sheets

(56) References Cited

FOREIGN PATENT DOCUMENTS

| | | |
|---|---|---|
| TW | 201724596 A | 7/2017 |
| TW | 202236611 A | 9/2022 |
| TW | 202245248 A | 11/2022 |

OTHER PUBLICATIONS

Office Action and and the search report mailed on May 28, 2024 related to Taiwanese Application No. 112129698.
Office Action and and the search report mailed on Mar. 14, 2025 related to Taiwanese Application No. 112129698.
Summary translation of Office Action and English Abstracts of foreign patent documents related to Taiwanese Application No. 112129698.
Office Action and and the search report mailed on Feb. 23, 2024 related to Taiwanese Application No. 112129698.

\* cited by examiner

SEMICONDUCTOR STRUCTURE AND METHOD OF MANUFACTURING THE SAME

TECHNICAL FIELD

The present disclosure relates to a semiconductor structure and a method of manufacturing the semiconductor structure. Particularly, the present disclosure includes a semiconductor memory structure and the method of forming the semiconductor memory structure.

DISCUSSION OF THE BACKGROUND

As the semiconductor industry has progressed into advanced technology nodes in pursuit of greater device performance and a higher device density, it has reached an advanced precision in photolithography. In order to further reduce device sizes, the dimensions of elements and distances between different elements have to be proportionally reduced. However, with the reductions in the dimensions of the elements and the distances between different elements, challenges of precise control of the dimensions and the distances have arisen.

One of the issues with the reduced size of the semiconductor devices is the planarity of the devices across the semiconductor wafer. In order to maintain the quality uniformity across different semiconductor devices levels, the component layers is required to achieve high flatness uniformity in the single semiconductor wafer and across different semiconductor wafers. However, the planarity in the fabricated semiconductor devices is usually limited given the reduced device footprint and the various material layers involved during the planarization process. As such, there is a need to study improved methods and structures to provide a reliable planarization scheme for ensuring reliability and performance of the semiconductor devices.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes: a data storage unit in a first dielectric layer; a word line disposed over the data storage unit; an array of conductive pads disposed over the word line; a hard mask layer disposed over the array of conductive pads; and a second dielectric layer laterally surrounding the hard mask layer and the array of conductive pads, the second dielectric layer is leveled with the hard mask layer.

According to some embodiments of the present disclosure, the array of conductive pads form a pattern following a pattern of the hard mask layer.

According to some embodiments of the present disclosure, the semiconductor structure further includes an anti-reflection coating over the hard mask layer.

According to some embodiments of the present disclosure, the semiconductor structure further includes a third dielectric layer over the second dielectric layer.

According to some embodiments of the present disclosure, the third dielectric layer is leveled with the second dielectric layer.

According to some embodiments of the present disclosure, the second dielectric layer fills a space between the array of conductive pads.

According to some embodiments of the present disclosure, the semiconductor structure further includes a plurality of channel layers extending through the word line.

According to some embodiments of the present disclosure, the semiconductor structure further includes an insulating film disposed between the word line and the plurality of channel layers.

According to some embodiments of the present disclosure, the channel layer comprises conductive oxide.

According to some embodiments of the present disclosure, the semiconductor further includes a conductive layer electrically coupling the word line to the plurality of channel layers, wherein the conductive layer comprises oxide.

One aspect of the present disclosure provides a method of manufacturing a semiconductor structure. The method includes: forming a word line in a first dielectric layer over a substrate; forming a channel layer through the word line; forming a conductive material over the channel layer; forming an etch stop layer over the conductive material; patterning the etch stop layer to form a pattern of a conductive pad; etching the conductive material using the pattern of the etch stop layer as an etching mask to form a conductive pad; depositing a second dielectric layer over the etch stop layer and the first dielectric layer; and planarizing the second dielectric layer, wherein the planarizing leaves at least a portion of the etch stop layer on the conductive pad.

According to some embodiments of the present disclosure, the planarizing includes using a chemical mechanical polishing (CMP) operation.

According to some embodiments of the present disclosure, during the CMP operation, the etch stop layer is leveled with the second dielectric layer.

According to some embodiments of the present disclosure, the method further includes-removing an entirety of the etch stop layer from the conductive pad.

According to some embodiments of the present disclosure, the removing of the entirety of the etch stop layer leaves a first trench in the second dielectric layer, further includes depositing the conductive material over the second dielectric layer and in the first trench.

According to some embodiments of the present disclosure, the method further includes thinning the conductive material to expose the second dielectric layer.

According to some embodiments of the present disclosure, the substrate includes a first region and a second region, the conductive pad is arranged in the first region of the substrate, further includes etching a via in the second region prior to the deposition of the conductive material in the first trench.

According to some embodiments of the present disclosure, the deposition of the conductive material in the first trench comprises filling the via with the conductive material to form a conductive via.

According to some embodiments of the present disclosure, the thinning of the conductive material level the conductive pad with the conductive via.

According to some embodiments of the present disclosure, the method further includes forming a second trench in the second dielectric layer by etching a portion of the conductive pad and a portion of the second dielectric layer.

According to some embodiments of the present disclosure, the forming of the second trench causes a forming of a bit line in the second trench to be electrically coupled to the conductive pad.

According to some embodiments of the present disclosure, the method further includes depositing a third dielectric layer to fill the second trench.

According to some embodiments of the present disclosure, the method further includes forming a capacitor in a fourth dielectric layer below the first dielectric layer.

According to some embodiments of the present disclosure, the method further includes depositing an insulating film on a sidewall of the word line prior to the forming of the channel layer.

According to some embodiments of the present disclosure, the second dielectric layer laterally surrounds the conductive pad.

One aspect of the present disclosure provides a method of manufacturing a semiconductor structure. The method includes: forming a data storage unit in a first dielectric layer; depositing a word line over the data storage unit; forming a conductive material over the word line; forming a patterned hard mask over the conductive material; etching the conductive material through the patterned hard mask to form a conductive pad; depositing a second dielectric layer over the patterned hard mask; and removing the second dielectric layer, wherein at least a portion of the patterned hard mask is left during the removing.

According to some embodiments of the present disclosure, the method further includes removing the etch stop layer.

According to some embodiments of the present disclosure, the method further includes forming a first conductive oxide layer through the word line.

According to some embodiments of the present disclosure, the conductive oxide layer comprises indium gallium zinc oxide.

According to some embodiments of the present disclosure, the method further includes depositing a second conductive oxide layer over the first conductive oxide layer and the word line prior to the depositing of the conductive material.

According to some embodiments of the present disclosure, the second oxide layer comprises indium titanium oxide.

According to some embodiments of the present disclosure, the patterned hard mask is formed of a material different from the first dielectric layer.

According to some embodiments of the present disclosure, the method further includes depositing a third dielectric layer to cover the second dielectric layer.

According to some embodiments of the present disclosure, the removing of the second dielectric layer levels an upper surface of the second dielectric layer with an upper surface of the third dielectric layer.

According to some embodiments of the present disclosure, the method further includes removing the patterned hard mask and depositing another portion of the conductive material on the conductive pad subsequent to the removing of the patterned hard mask.

Through the proposed planarization scheme of the present disclosure, the material layers of the semiconductor structure can be planarized with high planarity, and the electrical performance and reliability can be further enhanced. The device quality uniformity can thus be improved with a minimized additional cost of the process change.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description. It should be noted that, in accordance with the standard practice in the industry, various features are not drawn to scale. In fact, the dimensions of the various features may be arbitrarily increased or reduced for clarity of discussion.

FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, 1X, 1Y, 1Z, 1AA and 1AB are schematic cross-sectional views of intermediate stages of a method of forming a semiconductor structure, in accordance with some embodiments of the present disclosure.

DETAILED DESCRIPTION

Figure 1A:
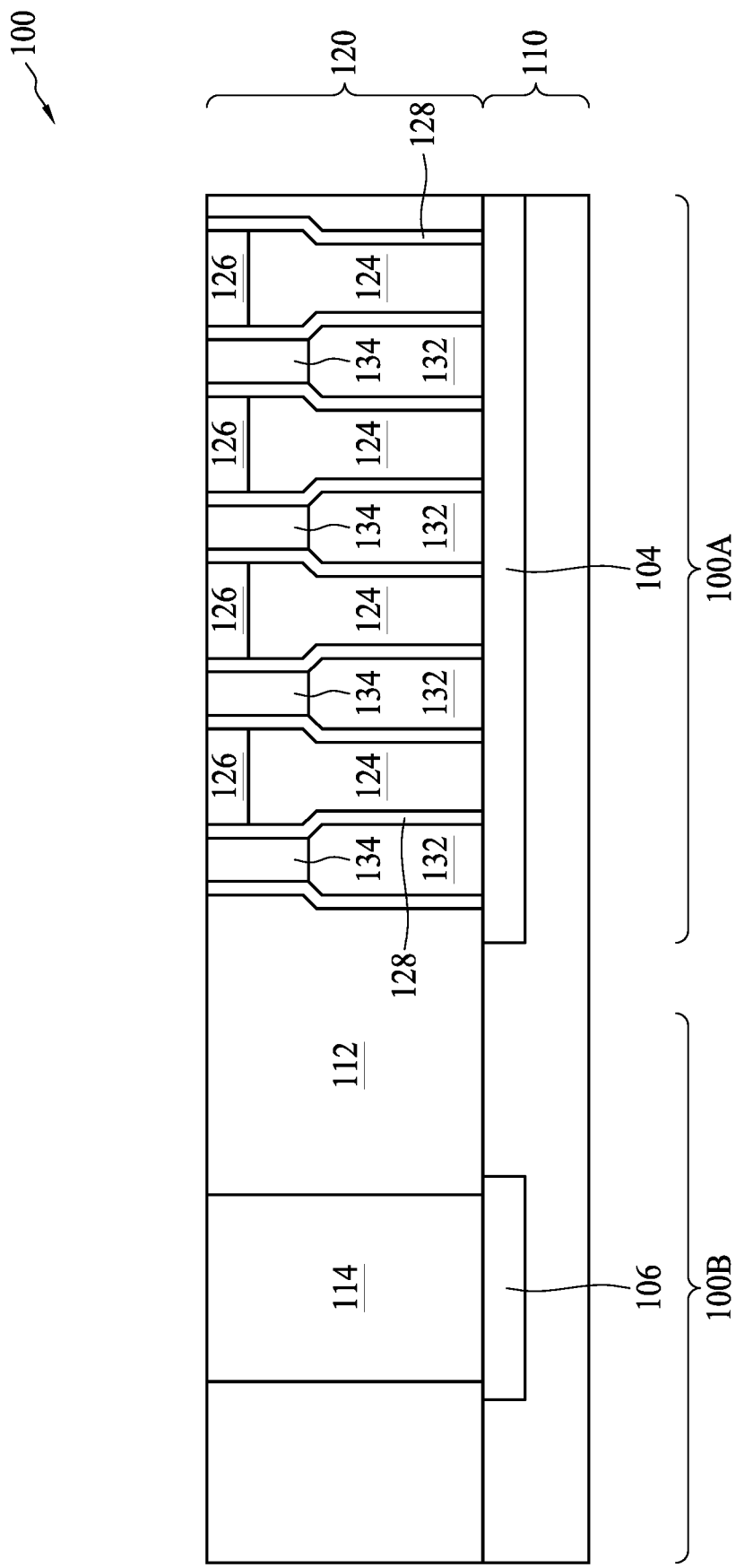

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

The terms "couple" or "connect" used throughout the present disclosure refers to physical or electrical linkage between two or more objects. These objects may also be referred to as being "coupled" or "connected" through exchange of data or information. These "coupled" or "connected" objects may be in direct contact in some cases or indirect contact through other intervening objects.

Embodiments of the present disclosure discuss a semiconductor structure formed of a plurality of memory cells and a method of forming a semiconductor structure. According to some embodiments of the present disclosure, each memory cell is formed of a transistor comprised of a word line, a bit line, a source line, and channel layer, and a data storage unit electrically coupled to the transistor. The transistor may be used to control access operations, e.g., read and write operation, of the data storage unit. According to some embodiments of the present disclosure, the channel layer is electrically coupled to the bit line through a landing pad. According to some comparative embodiments, the methods of forming an array of landing pads over an array of channel layers are generally performed by forming a dielectric layer over the array of channel layers, followed by etching the dielectric layer to form vias. Conductive materials are deposited in the vias to form the array of landing pads. In order to improve the performance of the memory cell, according to some embodiments of the present disclosure, the order of forming the array of landing pads and the dielectric layer is interchanged. However, in some examples, the height uniformity of the landing pads may not be maintained within a predetermined specification during a subsequent planarization operation, and the electrical property of the landing pads may not be ensured. The device reliability of the memory cells is thus compromised.

To address the abovementioned issues, an etch stop layer is introduced to protect the landing pads during the planarization process. The planarization process can be compatible with conventional process recipes, and the height uniformity of the landing pads can thus be maintained. Therefore, the landing pads can be formed with enhanced reliability, and the new structure of the memory cell can be manufactured with minimized defects.

FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, 1X, 1Y, 1Z, 1AA and 1AB are schematic cross-sectional views of intermediate stages of a method 10 of forming a semiconductor structure 100, in accordance with some embodiments of the present disclosure. It is understood that additional steps can be provided before, during, and after the steps shown by FIGS. 1A to 1AB, and some of the steps described below can be replaced or eliminated in additional embodiments of the method 10. The steps may be performed independently, and the order of the steps may be interchangeable.

Referring to FIG. 1A, according to some embodiments of the present disclosure, the semiconductor structure 100 is formed of a memory array, wherein the memory array includes dynamic random-access memory (DRAM) cells. A DRAM cell, e.g., represented by a memory cell of the semiconductor structure 100, is generally formed, of a data storage unit (memory unit) 124 configured to store data information and a control unit configured to perform the access operations on the data storage unit, such as a read operation and a write operation. The control unit is usually implemented by a transistor, e.g., field-effect transistor (FET), such as metal-oxide semiconductor (MOS) FET (MOSFET). According to different architectures of the transistors, the control unit of the DRAM can be formed of a planar FET. However, other types of FET, e.g., a fin-type FET (FinFET), a gate-all-around (GAA) FET, nanosheet FET, nanowire FET, or the like, are also within the contemplated scope of the present disclosure.

Referring to FIG. 1A, a substrate 110 is formed, received or provided. According to some embodiments of the present disclosure, the substrate 110 includes a semiconductor material such as bulk silicon. According to some embodiments of the present disclosure, the substrate 110 includes other semiconductor materials, such as silicon germanium, silicon carbide, gallium arsenide, or the like. According to some embodiments of the present disclosure, the substrate 110 is a p-type semiconductive substrate (acceptor type) or an n-type semiconductive substrate (donor type). Alternatively, the substrate 110 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. According to yet another embodiment of the present disclosure, the substrate 110 includes portions to form a semiconductor-on-insulator (SOI) substrate. In other alternatives, the substrate 110 may include a doped epitaxial layer, a gradient semiconductor layer, and/or a semiconductor layer overlaying another semiconductor layer of a different type, such as a silicon layer on a silicon germanium layer. According to some embodiments of the present disclosure, the substrate 110 is a hybrid substrate including first portions formed of a bulk silicon substrate and second portions formed of an SOI substrate.

According to some embodiments of the present disclosure, the semiconductor structure 100 includes a first region 100A and a second region 100B adjacent to the first region 100A. The first region 100A may be referred to herein as a memory array region, while the second region 100B may be referred to herein as a peripheral region. According to some embodiments of the present disclosure, the second region 100B is arranged in a periphery of the substrate 110 or laterally surrounds the first region 100A.

Figure 2:
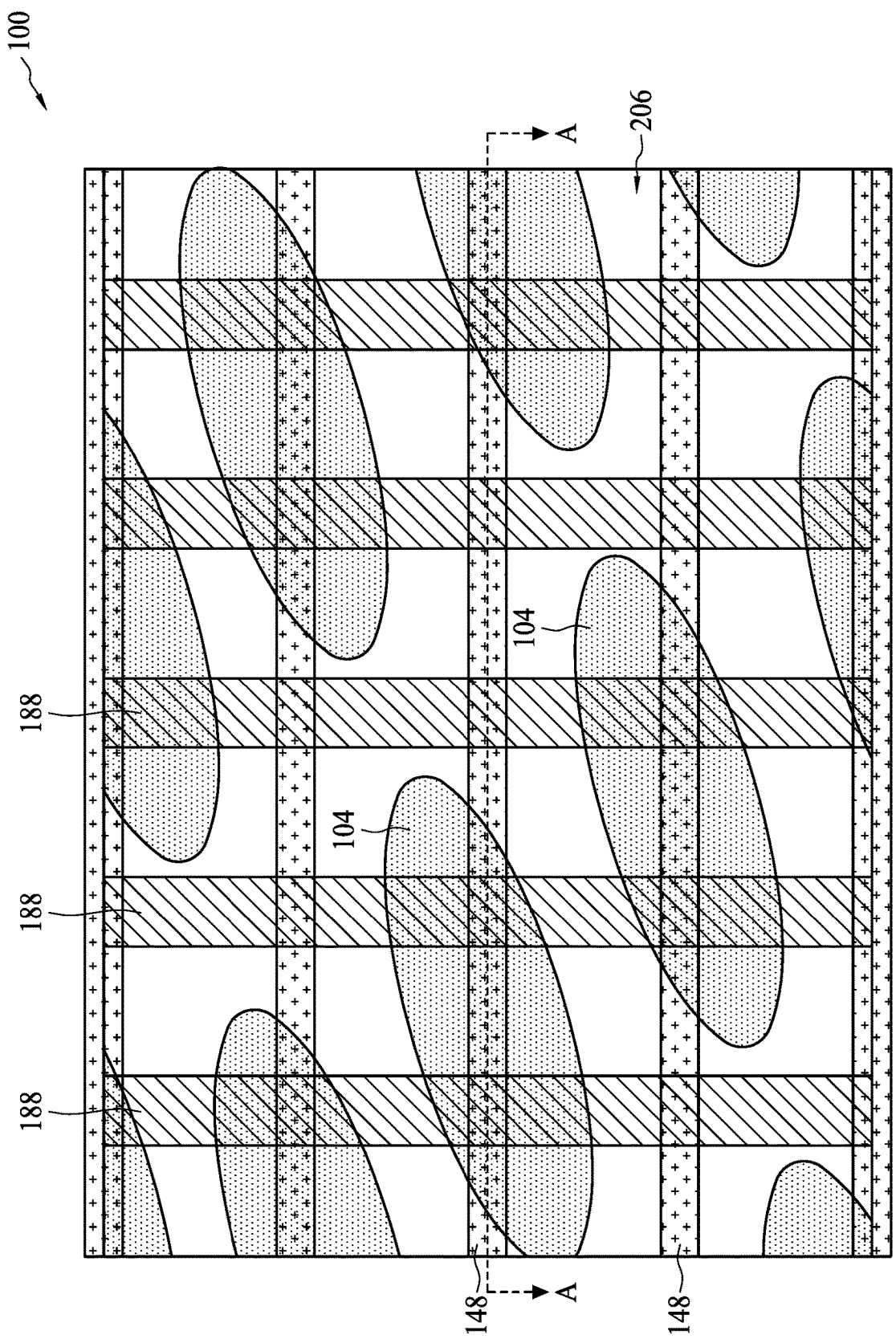
FIG. 2 is a schematic top view of a semiconductor structure, in accordance with various embodiments of the present disclosure.

According to some embodiments of the present disclosure, an array of active regions 104 are formed in the substrate 110. The active regions 104 may be formed of doped regions with an N-type or P-type dopant. According to some embodiments of the present disclosure, the N-type dopant includes phosphorus (P), arsenic (As), antimony (Sb), or other suitable materials. According to some embodiments of the present disclosure, the P-type dopant includes boron (B) or indium (In), or other suitable materials. A top view of the active regions 104 is shown in FIG. 2. Referring to FIG. 2, the active regions 104 may be separated by isolation regions 206, wherein the isolation regions 206 is formed of a dielectric material, e.g., silicon oxide, silicon nitride, silicon carbide, silicon oxynitride, high-k dielectric materials, or other suitable dielectric materials. According to some embodiments of the present disclosure, the active regions 104 have an oval or ellipse shape from a top-view perspective. The active regions 104 may be formed to include source/drain regions therein for each control unit. According to some embodiments of the present disclosure, the isolation regions 206 define and electrically separate the active regions 104.

Referring to FIG. 1A, one or more semiconductor devices 106 are formed in the substrate 110 in the second region 100B. The semiconductor device 106 may be utilized to perform auxiliary control functions for the memory cells of the semiconductor structure 100, e.g., they can performing data multiplexing, data demultiplexing, data encoding, data decoding, signal filtering, etc. The semiconductor device 106 may include one or more of active devices, e.g., transistors or the like, or one or more passive devices, e.g., resistors, capacitors, inductors, diodes, fuses, or the like. The transistor is usually implemented by a field-effect transistor (FET), such as metal-oxide semiconductor (MOS) FET (MOSFET). According to different architectures, the transistor 106 in the second region 100B can be formed of a planar FET. However, other types of FET, e.g., a fin-type FET (FinFET), a gate-all-around (GAA) FET, nanosheet FET, nanowire FET, or the like, are also within the contemplated scope of the present disclosure.

A first layer 120 is formed over the substrate 110. According to some embodiments of the present disclosure, a dielectric layer 112 is formed in the first layer 120. The dielectric layer 112 may include a dielectric material, e.g., silicon oxide, silicon nitride, silicon carbide, silicon oxynitride, high-k dielectric materials, or other suitable dielectric materials. The first layer 120 may be a single layer structure or a multilayer structure formed of sublayers of various dielectric layers 112. The dielectric layer 112 may be formed through deposition, such as chemical vapor deposition (CVD), physical vapor deposition (PVD), atomic layer deposition (ALD), spin-on coating, or other suitable deposition methods.

According to some embodiments of the present disclosure, a conductive via 114 is formed in the first layer 120 of the second region 110B and extending through the dielectric layer 112. The conductive via 114 may be electrically coupled to the underlying semiconductor device 106. The conductive via 114 is formed of a conductive material, e.g., copper, aluminum, tungsten, silver, gold, titanium, titanium nitride, tantalum, tantalum nitride, alloys thereof, of the like. As an example formation process of the conductive via 114, a patterning operation is performed to form a trench (not separately shown) extending through the first layer 120 above the semiconductor device 106. The patterning operation may include photolithography and etching operations. The etching operation may include a dry etch, a wet etch, a combination thereof (e.g., reactive ion etch, RIE), or the like. Subsequently, a conductive material is deposited in the trench and over the upper surface of the dielectric layer 112 using, e.g., CVD, PVD, ALD, or the like. According to some embodiments, a planarization operation, such as chemical mechanical polishing (CMP) or mechanical grinding, is performed to remove the excess conductive material to thereby form the conductive via 114 and level the upper surface of the conductive via 114 with the upper surface of the dielectric layer 112.

According to some embodiments of the present disclosure, one or more dielectric layers 132, 134 are formed in the first layer 120 of the first region 110A. Each of the dielectric layers 132, 134 may include a dielectric material, e.g., silicon oxide, silicon nitride, silicon carbide, silicon oxynitride, high-k dielectric materials, or other suitable dielectric materials. The formation method of the dielectric layers 132, 134 may be similar to that of the dielectric layer 112. According to some embodiments, the first layer 120 includes a multilayer structure formed of the dielectric layers 132, 134, instead of the single-layer structure 112, and extending across the first region 110A and the second region 110B.

An array of data storage units 124 is formed in the first layer 120, e.g., in the dielectric layers 132, 134, of the first region 110A. The array of data storage units 124 may be electrically coupled to the underlying active regions 104. Each of the data storage units 124 is formed of a capacitor, which can be a deep-trench type capacitor, or a metal-insulator-metal (MIM) type capacitor. According to some embodiments of the present disclosure, each of the data storage units 124 is formed of two electrode plates and an insulating film between the two electrode plates, where only one electrode plate (labelled also by numerals 124) of each data storage unit 124 is illustrated in FIG. 1A. The electrode plates of the data storage unit 124 are formed of a conductive material, e.g., copper, aluminum, tungsten, silver, gold, titanium, titanium nitride, tantalum, tantalum nitride, alloys thereof, of the like, using CVD, PVD, ALD, or other suitable deposition methods. The insulating film between the electrode plates may be formed of dielectric materials, such as silicon oxide, silicon nitride, high-k dielectric materials, or the like.

According to some embodiments of the present disclosure, the semiconductor structure 100 further include a conductive layer 126 arranged on an upper side of each data storage unit 124. The conductive layer 126 may include a conductive oxide layer formed of a conductive oxide material, e.g., indium tin oxide (ITO), indium tungsten oxide (IWO), or other conductive oxide layer. According to some embodiments, the conductive layer 126 includes transparent conductive oxide. The conductive layer 126 may be used to electrically couple the electrode plate of the data storage unit 124 to the overlying structures. The conductive layer 126 may be formed by CVD, PVD, ALD, or other suitable deposition methods.

According to some embodiments of the present disclosure, each of the data storage units 124 includes a liner 128 formed on sidewalls of the electrode plate. The liner 128 may include a dielectric material, e.g., silicon oxide, silicon nitride, silicon carbide, silicon oxynitride, high-k dielectric materials, or other suitable dielectric materials. According to some embodiments of the present disclosure, the liner 128 is deposited in a conformal manner along sidewalls of the electrode plates with a substantially uniform thickness. According to some embodiments of the present disclosure, the upper surfaces of the dielectric layer 112, the conductive via 114, the dielectric layer 134, the liner 128, and the conductive layer 126 are coplanar with each other.

According to some embodiments of the present disclosure, the electrode plate labeled by the numeral 124 includes two segments from a cross-sectional view. An upper segment of the electrode plate 124 is connected to a lower segment of the electrode plate 124, wherein the upper segment may have a greater width than a width of the lower segment.

Figure 1B:
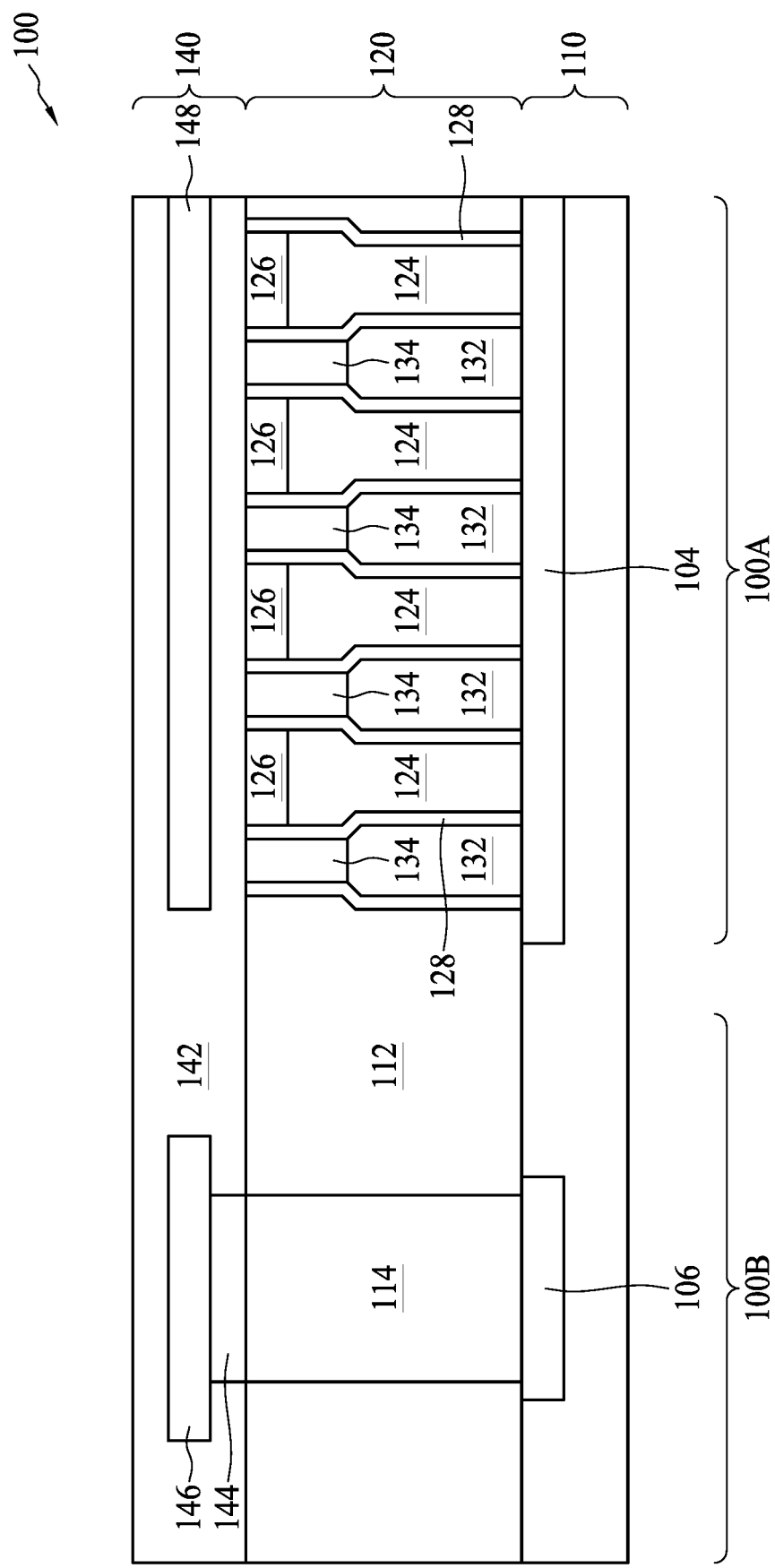

Referring to FIG. 1B, a second layer 140 is formed over the first layer 120. The second layer 140 includes a dielectric layer 142 formed across the first region 100A and the second region 100B. The dielectric layer 142 may include a dielectric material, e.g., silicon oxide, silicon nitride, silicon carbide, silicon oxynitride, high-k dielectric materials, or other suitable dielectric materials. The dielectric layer 142 may be a single layer structure or a multilayer structure formed of sublayers of various dielectric materials, e.g., by CVD, PVD, ALD, or other suitable deposition method.

A word line 148 is formed in the second layer 140 in the first region 110A. The word line 148 may be surrounded and electrically insulated by the dielectric layer 142. The word line 148 may include a conductive material, such as tungsten; however, other suitable conductive materials, e.g., copper, aluminum, silver, gold, titanium, titanium nitride, tantalum, tantalum nitride, alloys thereof, are also within the contemplated scope of the present disclosure.

A conductive pad 144 and a conductive line 146 are formed in the second layer 140 in the second region 110B. The conductive pad 144 may electrically couple the conductive via 114 to the conductive line 146. According to some embodiments of the present disclosure, the conductive pad 144 and the word line 148 are formed at the same elevation of the second layer 140 during a single deposition operation. The conductive pad 144 and the conductive line 146 may include a conductive material, such as tungsten; however, other suitable conductive materials, e.g., copper, aluminum, silver, gold, titanium, titanium nitride, tantalum, tantalum nitride, alloys thereof, are also within the contemplated scope of the present disclosure.

As an example formation process, a first dielectric sublayer (not separately shown) of the dielectric layer 142 is deposited over the surface of the first layer 120. A patterning operation is performed to form recesses on the upper surface of the first dielectric sublayer. A conductive material of the conductive pad 144 is deposited in the recesses of the first dielectric sublayer. According to some embodiments of the present disclosure, a planarization operation may be used to remove the excess material of the conductive material over the upper surface of the first dielectric sublayer to thereby form the conductive pad 144. Subsequently, a second dielectric sublayer (not separately shown) is then deposited over the first dielectric sublayer and the conductive pad 144, e.g., by a suitable deposition method. A patterning operation is performed to form recesses on the upper surface of the second dielectric sublayer. A conductive material of the word line 148 and the conductive line 146 is deposited in the recesses of the first dielectric sublayer. According to some embodiments of the present disclosure, a planarization operation may be used to remove the excess material of the conductive material over the upper surface of the second dielectric sublayer to thereby form the word line 148 and the conductive line 146. A third dielectric sublayer (not separately shown) is then deposited over the second dielectric sublayer, the word line 148, and the conductive line 146, e.g., by a suitable deposition method.

Figure 1C:
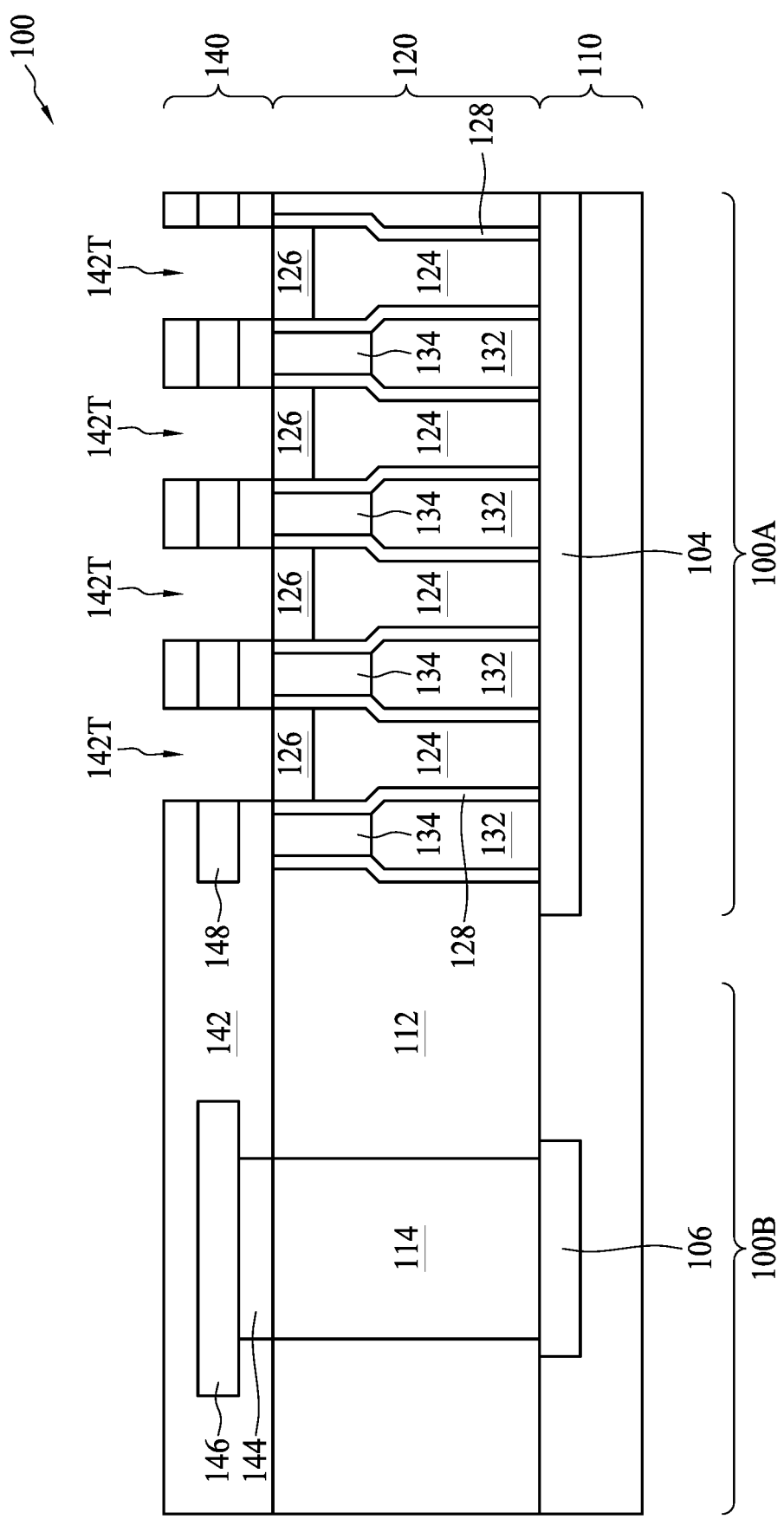

Referring to FIG. 1C, the second layer 140 is patterned to form a plurality of trenches 142T in the first region 110A, in which the plurality of trenches 142T extend through the word line 148 and align the corresponding data storage units 124. Upper surfaces of the corresponding conductive layers 126 are exposed accordingly. The trenches 142T may have a diameter or width less than the width of the word line 148 such that the portions of the trenches 142T at the same level as the word line 148 are within the circumference of the word line 148. According to some embodiments of the present disclosure, the trenches 142T are formed by photolithography and etching operations. The etching operation may be performed by a dry etch, a wet etch, an RIE, or the like.

Figure 1D:
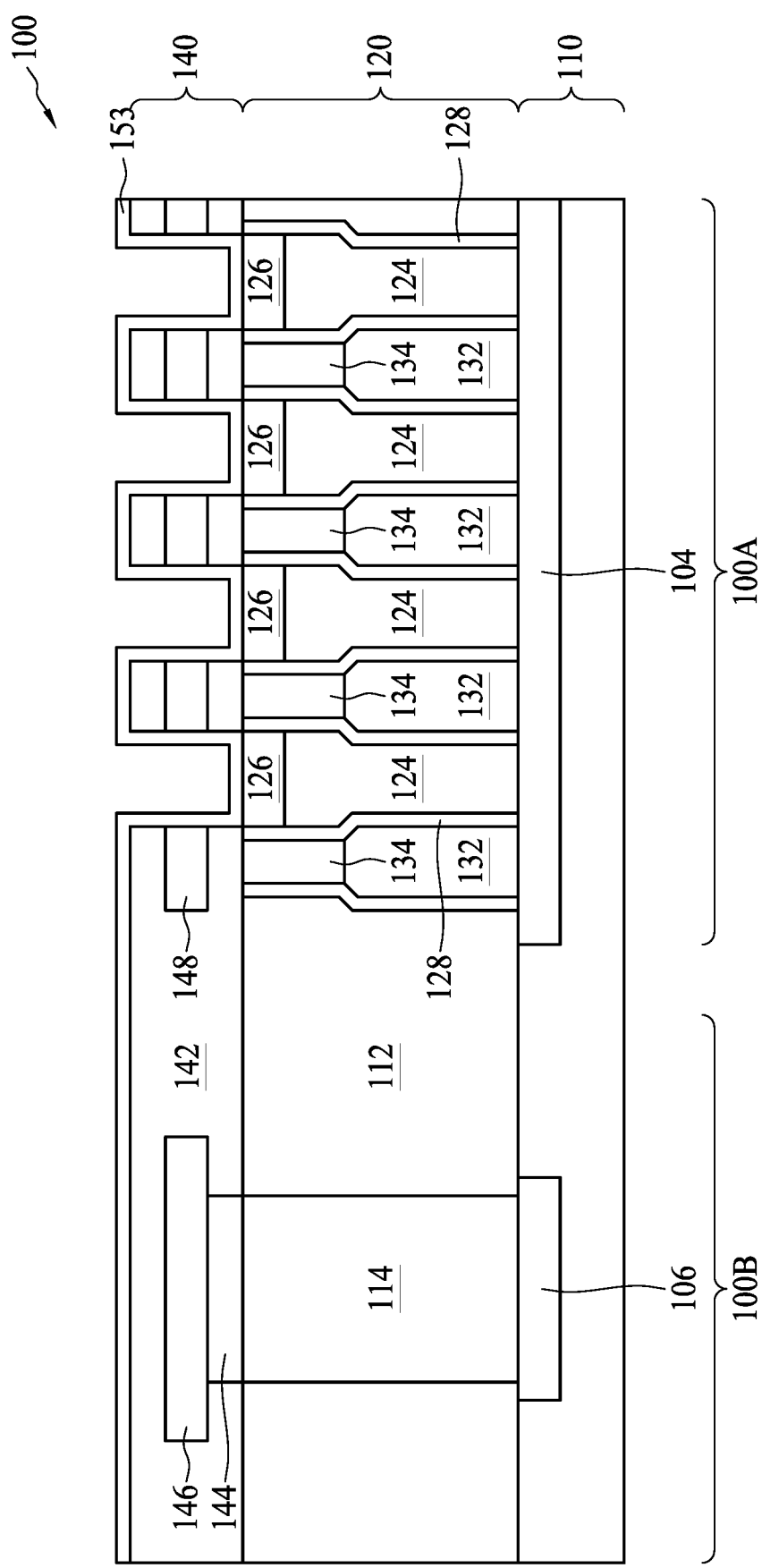

Referring to FIG. 1D, an insulating film 153 is deposited on the sidewalls and bottoms of the trenches 142T. The insulating film 153 may further be deposited over the surface of the dielectric layer 142. The insulating film 153 may include a dielectric material, such as silicon oxide; however, other dielectric materials, e.g., silicon nitride, silicon carbide, silicon oxynitride, high-k dielectric materials, or other suitable dielectric materials, are also within the contemplated scope of the present disclosure. The insulating film 153 may be deposited to a substantially uniform thickness, i.e., in a conformal manner, using CVD, ALD, or other suitable deposition methods.

Figure 1E:
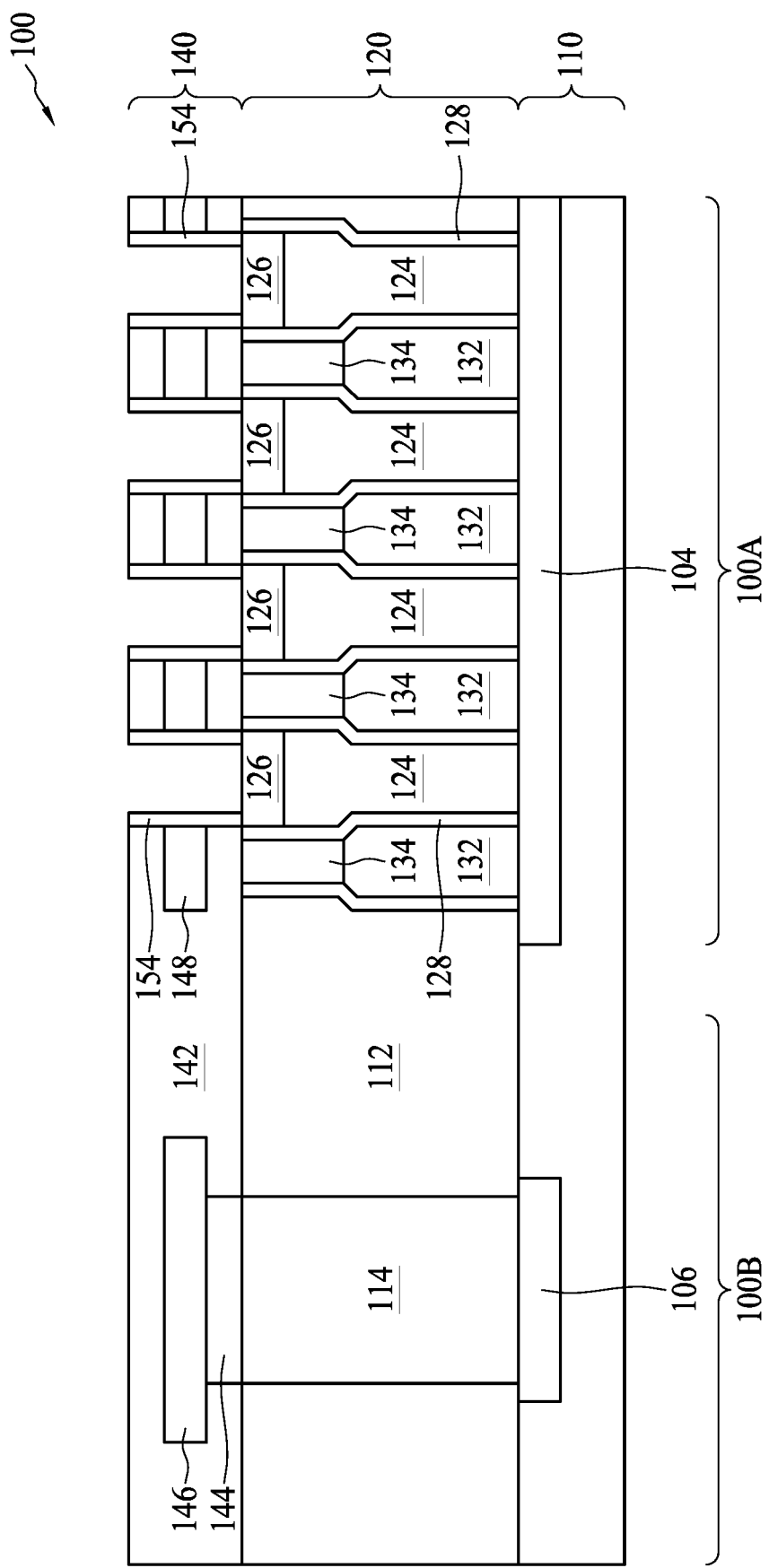

FIG. 1E illustrates an etching operation on the insulating film 153. Insulating films 154 are formed on the sidewalls of the individual trenches 142T accordingly. The etching operation may be performed using an anisotropic etching operation to etch the horizontal portions of the insulating film 153 at the bottoms of the trenches 142T and the upper surface of the dielectric layer 142. The etching operation may include a dry etch, a wet etch, an RIE, or the like.

Figure 1F:
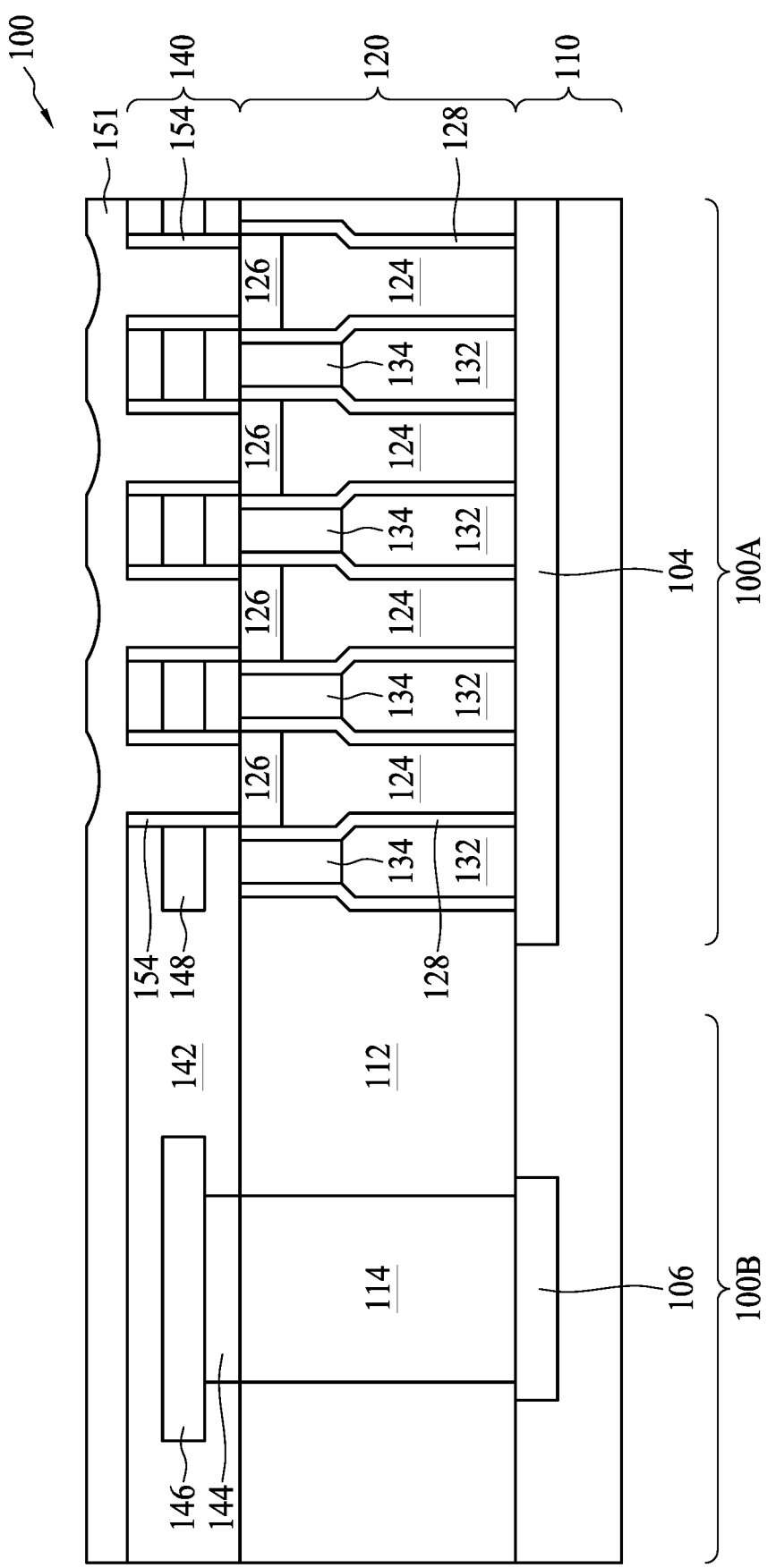

Referring to FIG. 1F, a conductive oxide layer 151 is deposited in the trenches 142T between the insulating films 154. The conductive oxide layer 151 may also be deposited over the surface of the dielectric layer 142. According to some embodiments, the conductive oxide layer 151 includes transparent conductive oxide. According to some embodiments of the present disclosure, the conductive oxide layer 151 includes indium gallium zin oxide (IGZO) or other suitable conductive oxide materials.

Figure 1G:
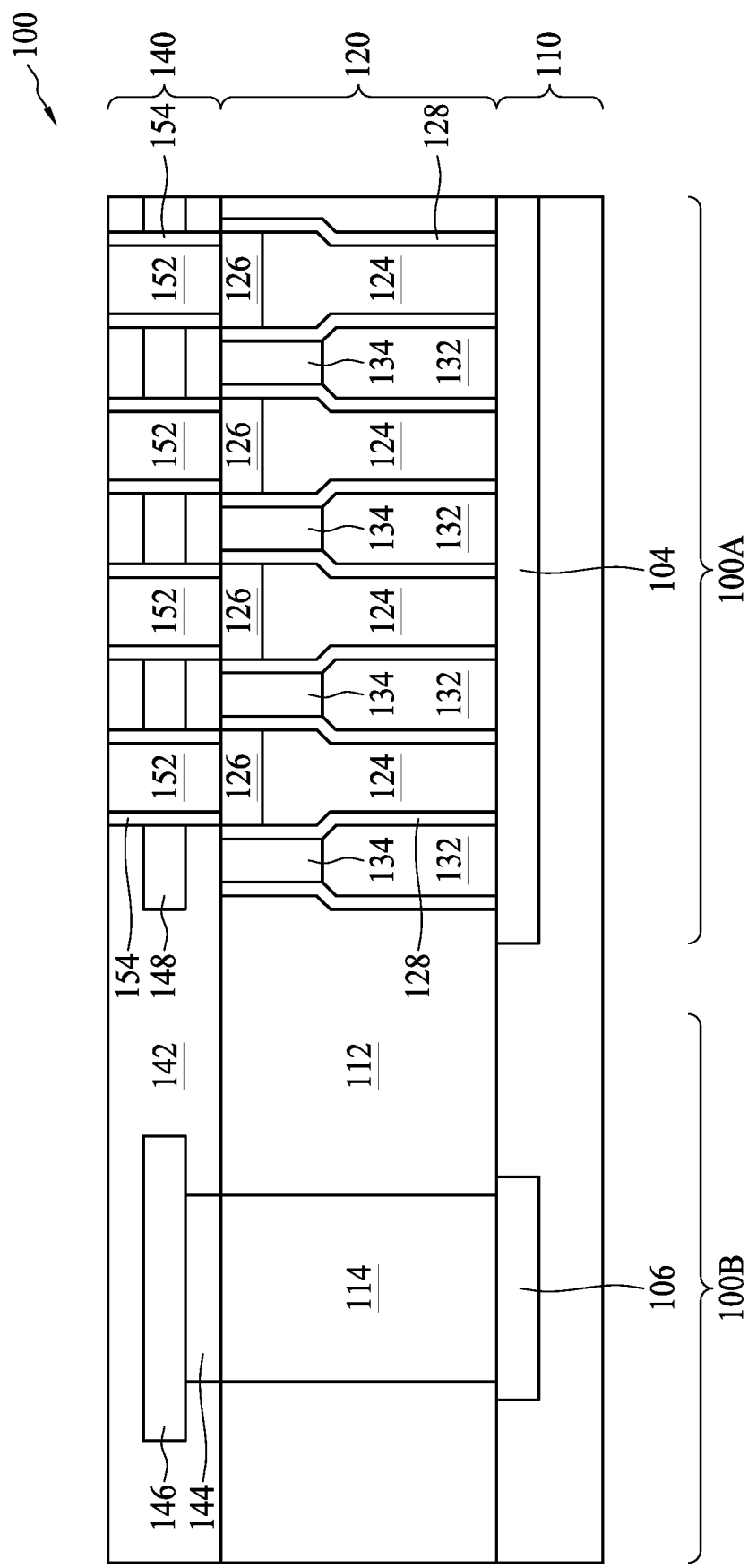

Referring to FIG. 1G, a planarization operation is performed to remove the excess materials of the conductive oxide layer 151 to form individual channel layers 152. The planarization operation may also cause the upper surface of the channel layers 152 to be leveled with the surface of the dielectric layer 142. The planarization operation may be performed using CMP, mechanical grinding, or other suitable polishing operations. According to some embodiments of the present disclosure, the channel layer 151 serve as the channels of the respective control units for allowing an access current to flow through. The word line 148 is electrically insulated from the channel layers 152 through the intervening insulating films 154, and configured to be biased at a suitable voltage to control the movement of carriers in the channel layers 152 during a read or write operation. According to some embodiments of the present disclosure, each channel layer 152 extends through the word line 148 and therefore is laterally surrounded by the word line 148.

Figure 1H:
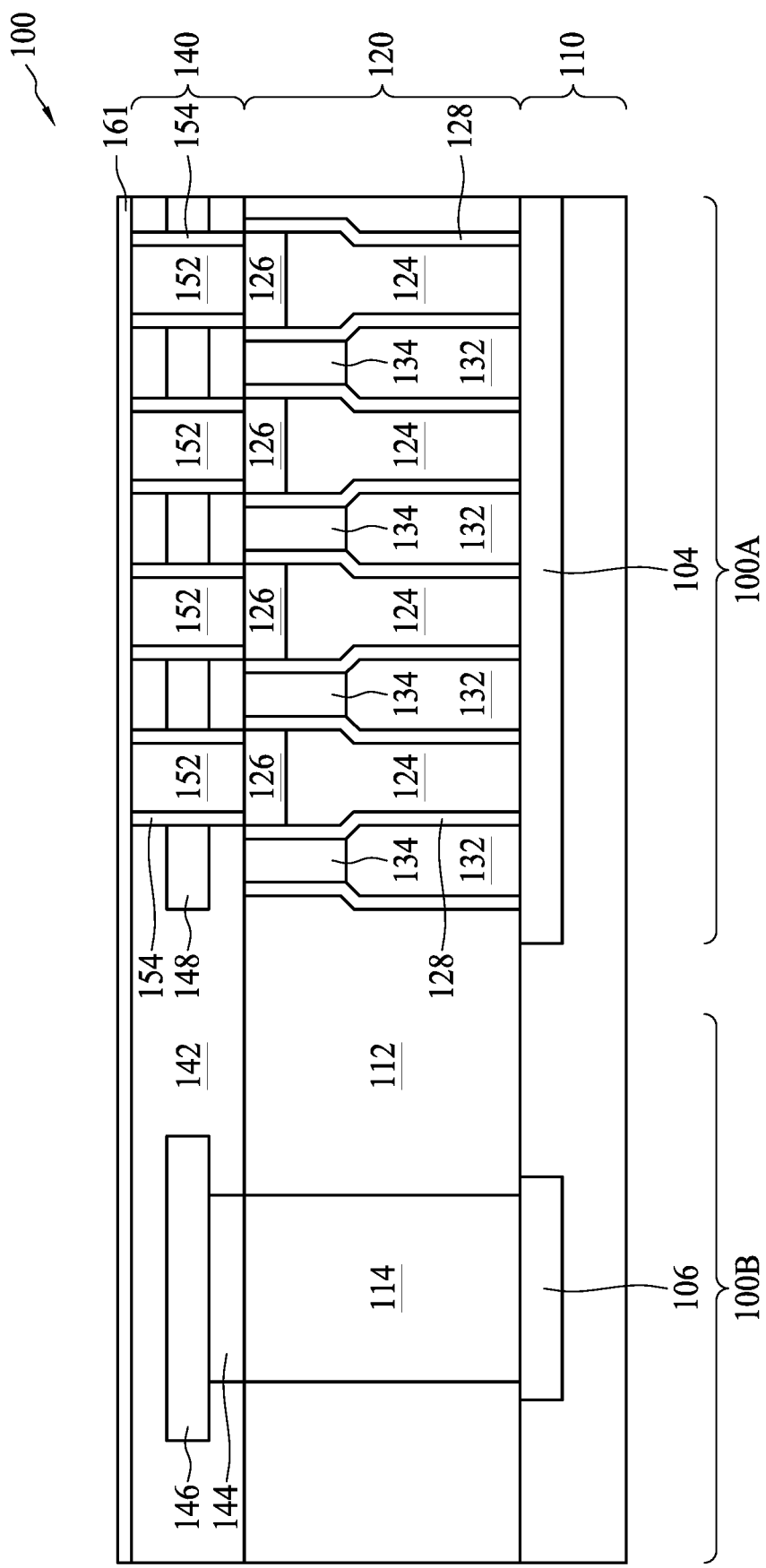

Referring to FIG. 1H, a conductive material 161 is deposited over an upper surface of the second layer 140. According to some embodiments of the present disclosure, the conductive material 161 extends across the first region 110A and the second region 110B. The conductive material 161 may cover each of the channel layers 152. The conductive material 161 (or a patterned conductive layer 162 formed therefrom, see FIG. 1M) may be used to electrically couple the channel layers 152 to the overlying structures through a patterning operation, details of which will be discussed later. According to some embodiments of the present disclosure, the conductive material 161 includes a conductive oxide material, e.g., indium tin oxide (ITO), indium tungsten oxide (IWO), or other conductive oxide material. According to some embodiments, the conductive material 161 includes transparent conductive oxide. The conductive material 161 may include a material similar to that of the conductive layer 126. The conductive material 161 may be formed by CVD, PVD, ALD, or other suitable deposition methods. According to some embodiments of the present disclosure, all of the channel layer 152, the conductive layer 126 and the conductive material 161 (or the patterned conductive layer 162) are formed of conductive oxide materials. According to some embodiments of the present disclosure, the channel layer 152 includes a conductive oxide material different from that of the conductive layer 126 or the conductive material 161 (or the patterned conductive layer 162).

Figure 1I:
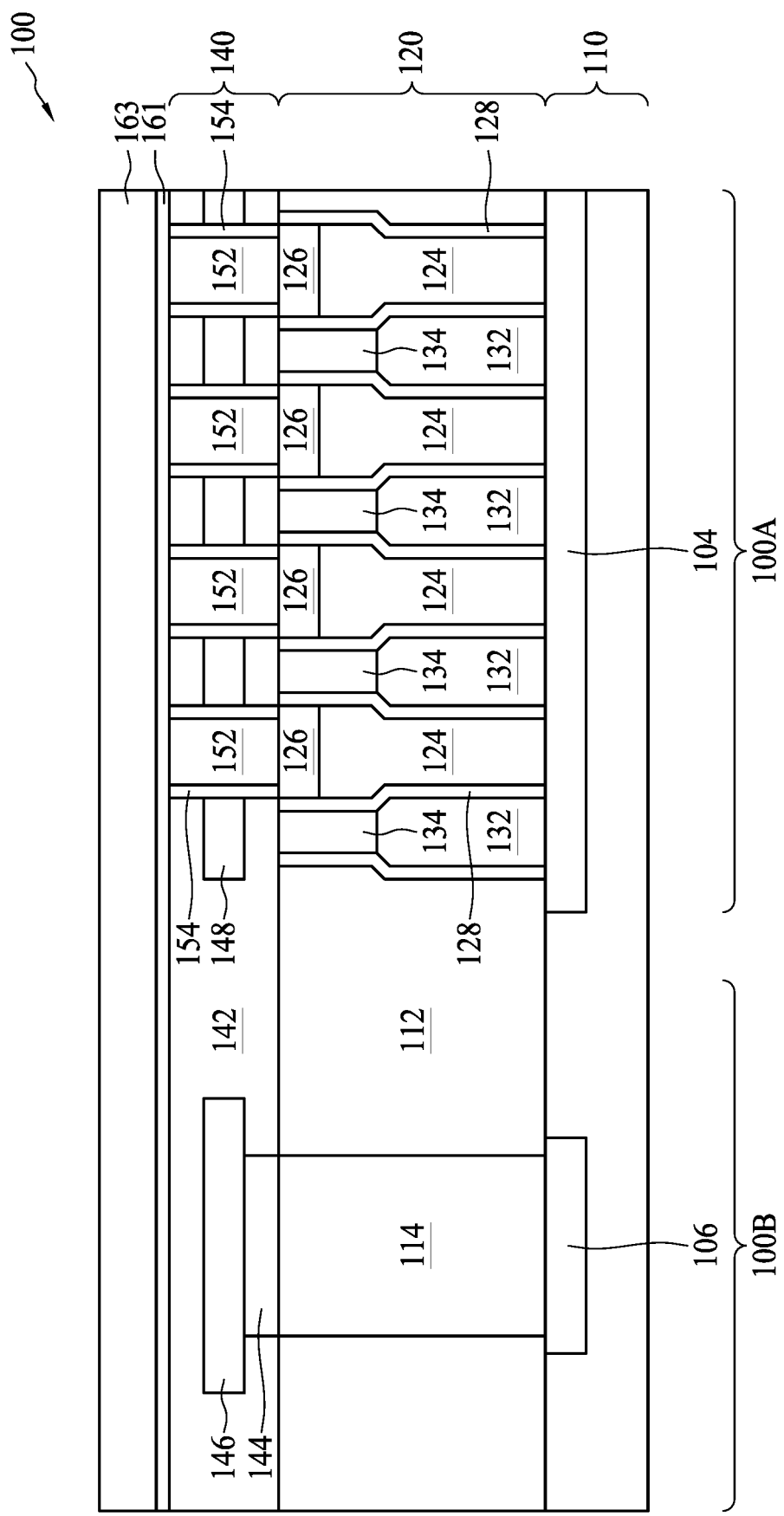

Referring to FIG. 1I, another conductive material 163 is deposited over an upper surface of the conductive material 161. According to some embodiments of the present disclosure, the conductive material 163 extends across the first region 110A and the second region 110B. According to some embodiments of the present disclosure, the conductive material 163 includes a metallic material, e.g., tungsten; however, other suitable conductive materials, e.g., copper, aluminum, silver, gold, titanium, titanium nitride, tantalum, tantalum nitride, alloys thereof, are also within the contemplated scope of the present disclosure. The conductive material 163 may be formed by CVD, PVD, ALD, or other suitable deposition methods. According to some embodiments of the present disclosure, the conductive material 163 includes a metallic material similar to the word line 148.

Figure 1J:
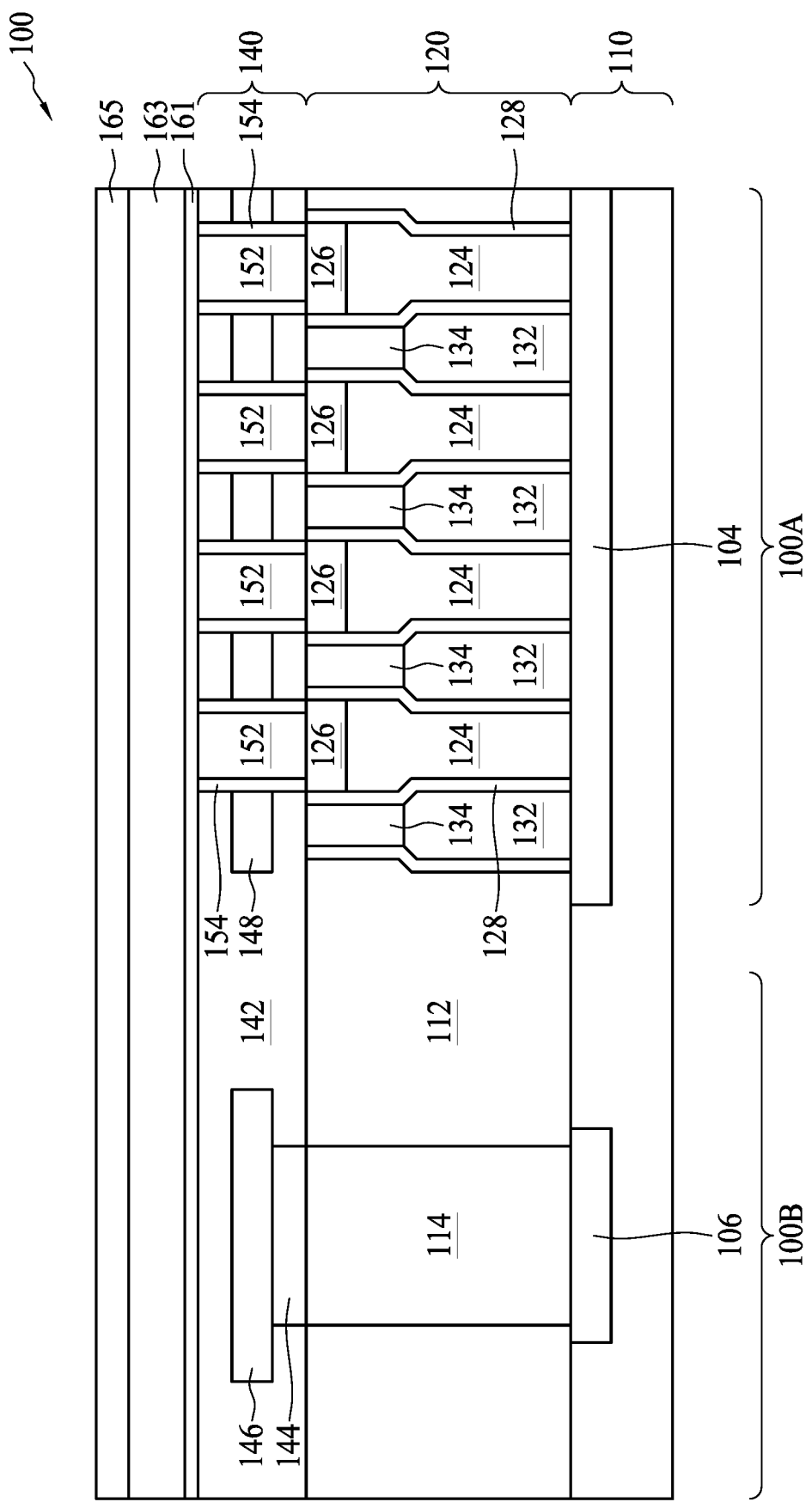

Referring to FIG. 1J, an etch stop layer 165 is deposited over an upper surface of the conductive material 163. According to some embodiments of the present disclosure, the etch stop layer 165 extends across the first region 110A and the second region 110B. According to some embodiments of the present disclosure, the etch stop layer 165 includes silicon nitride, silicon carbide, carbon, silicon oxynitride, high-k dielectric materials, or other suitable dielectric material. The etch stop layer 165 may serve as a hard mask that will be patterned during a pattering operation to form a patterned array of conductive pads from the conductive materials 161 and 163. The etched stop layer 165 may be formed by CVD, PVD, ALD, or other suitable deposition methods.

Figure 1K:
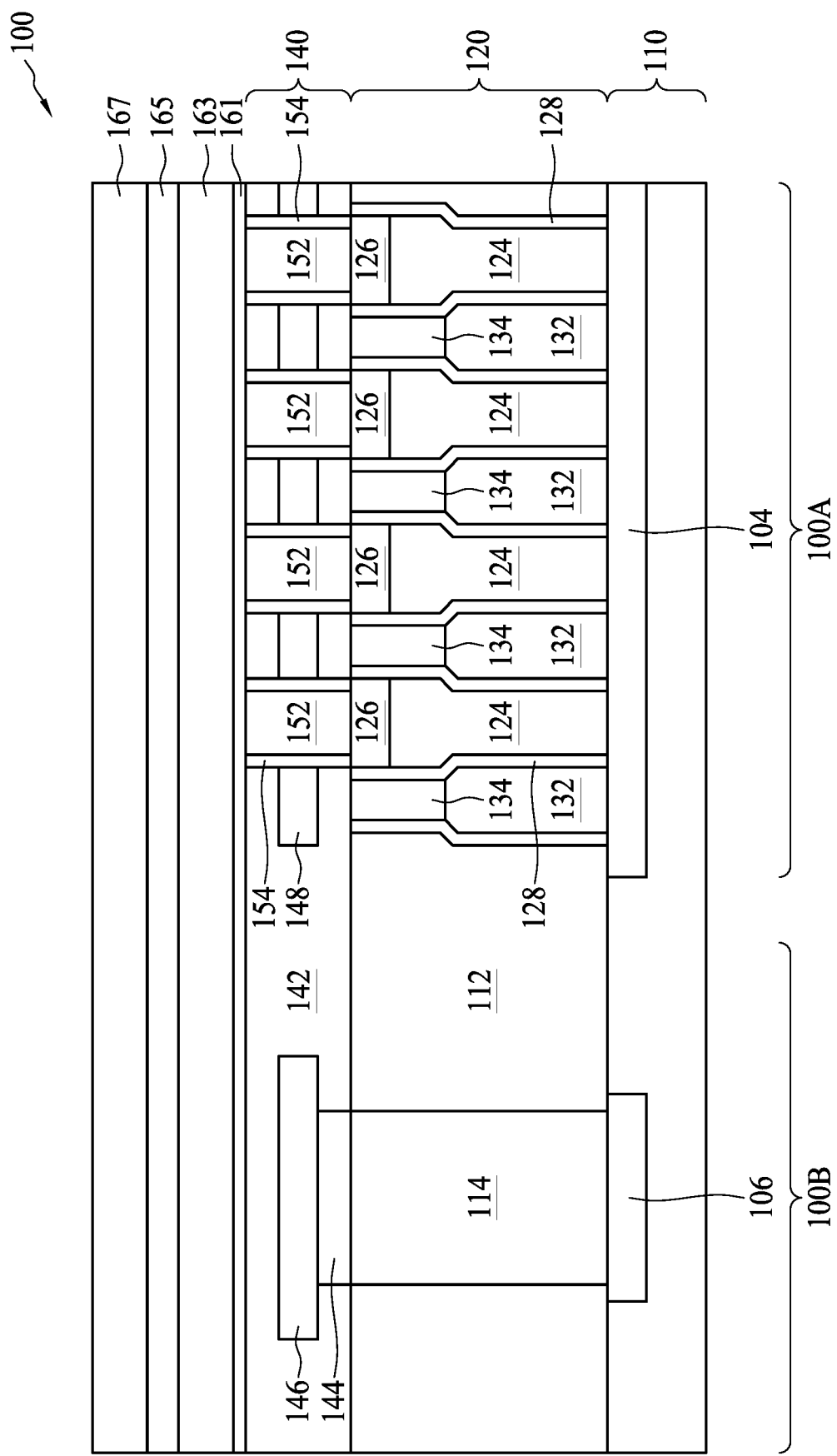

Referring to FIG. 1K, a hard mask layer 167 is deposited over the etch stop layer 165. The According to some embodiments of the present disclosure, the hard mask layer 167 extends across the first region 110A and the second region 110B. According to some embodiments of the present disclosure, the hard mask layer 167 includes a material different from the etch stop layer 165, e.g., the hard mask layer is formed of carbon or other suitable materials such as silicon oxynitride and high-k dielectric materials. The hard mask layer 167 may serve as a mask layer that will be patterned during a pattering operation to form a pattern and transfer such pattern to the etch stop layer 165. The hard mask layer 167 may be formed by CVD, PVD, ALD, or other suitable deposition methods.

Figure 1L:
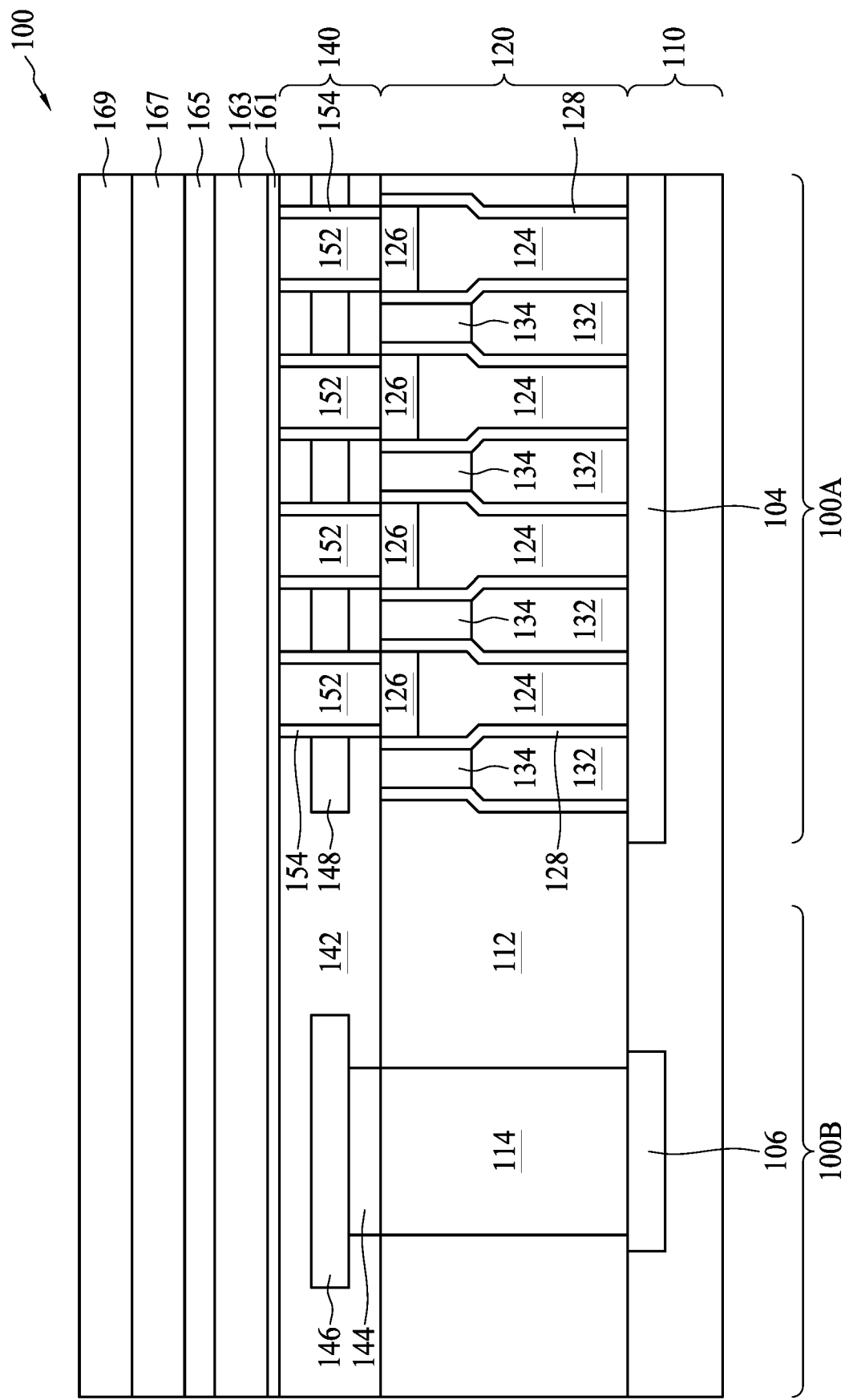

Referring to FIG. 1L, a photoresist or a mask layer 169 is deposited over an upper surface of the hard mask layer 167. According to some embodiments of the present disclosure, the photoresist 169 extends across the first region 110A and the second region 110B. According to some embodiments of the present disclosure, the photoresist 169 can be etched into a specific pattern during a photolithography operation for facilitating the etching operation of the underlying layers. According to some embodiments of the present disclosure, the photoresist 169 is formed of a multilayer structure and includes an under layer used as an antireflection coating. The under layer may include a polymer-based material. According to some embodiments of the present disclosure, the photoresist 169 further includes a dielectric antireflection coating (DARC) deposited over the under layer. According to some embodiments of the present disclosure, the DARC includes a dielectric material, e.g., silicon oxide, silicon nitride, silicon oxynitride, or other suitable dielectric materials. According to some embodiments of the present disclosure, the under layer and the DARC are formed by CVD, PVD, ALD, spin-on coating, or other suitable deposition methods.

Figure 1M:
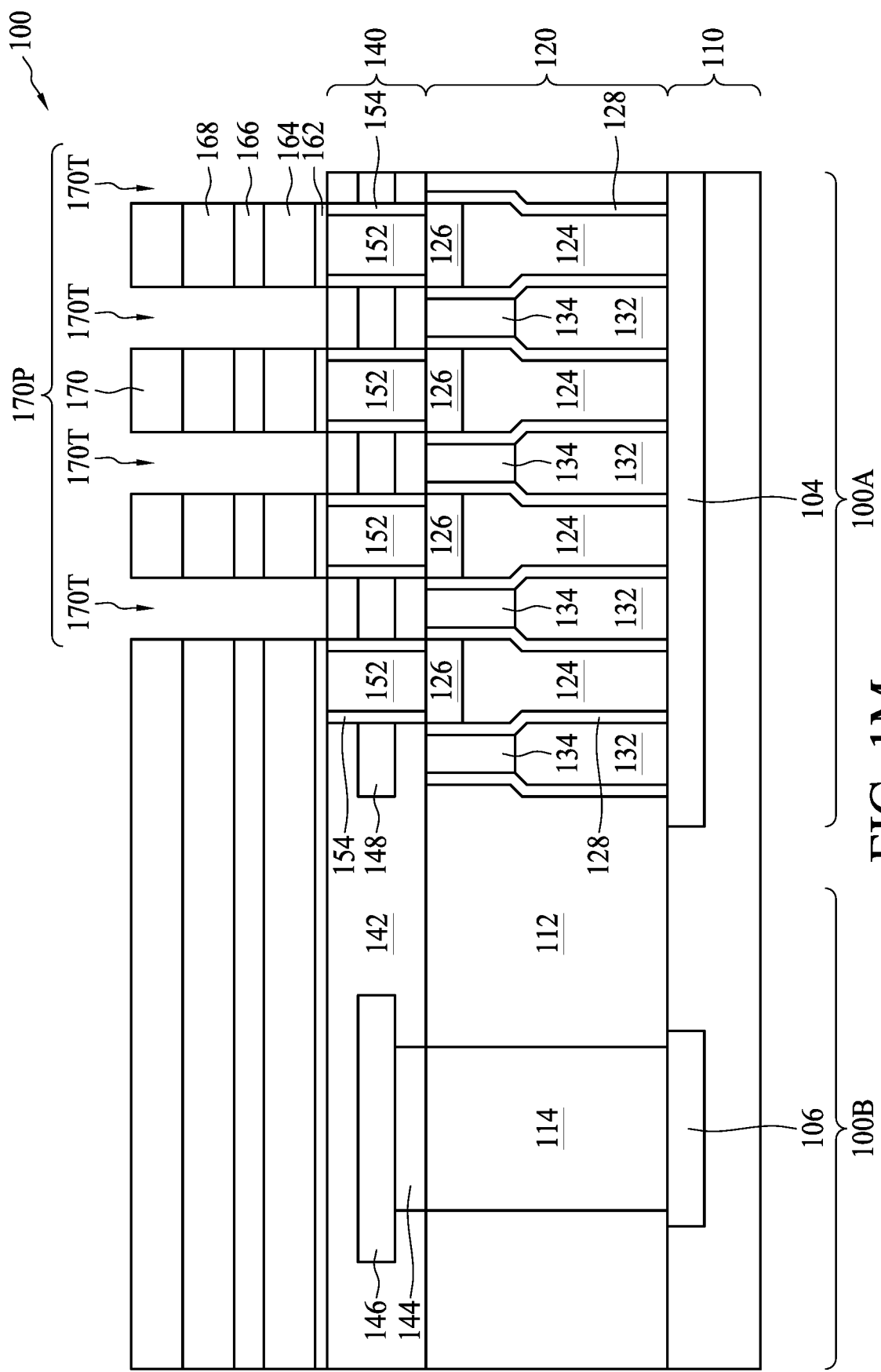

Referring to FIG. 1M, one or more patterning operations are performed to sequentially pattern the stack of the hard mask layer 167, the etch stop layer 165, the conductive material 163 and the conductive material 161. As an example formation process, the photoresist 169 is etched into a patterned photoresist or a patterned mask layer 170, in which the patterned photoresist 170 includes a pattern 170P corresponding to a pattern of conductive pads. The hard mask layer 167 is patterned into a patterned hard mask layer 168 by a first etching operation using the patterned photoresist 169 as an etching mask. The pattern 170P is thus transferred from the patterned photoresist 170 to the patterned hard mask layer 168. Subsequently, the etch stop layer 165 is patterned into a patterned etch stop layer 166 by a second etching operation using the patterned hard mask layer 166 as an etching mask. The pattern 170P is thus transferred to the patterned etch stop layer 166. The patterned etch stop layer 166 is used by a third etching operation to pattern the conductive material 163 and the conductive material 151 into an array of conductive pads 164 and an array of conductive layers 162. The pattern 170P is thus transferred to the conductive pads 164 and conductive layers 162. According to some embodiments, the conductive pads 164 serve as landing pads to electrically couple to bit lines 188 (described later) of the semiconductor structure 100.

According to some embodiments of the present disclosure, each of the first etching operation, the second etching operation and the third etching operation may be performed by a dry etch, a wet etch, an RIE, or the like. The first etching operation, the second etching operation, and the third etching operation may be performed in a single operation or performed separately. Similarly, the etching of the conductive material 161 and the conductive material 163 can be performed by subsequent etching operations or during a single etching operation. According to some embodiments of the present disclosure, through the one or more patterning operations, a portion of the upper surface of the dielectric layer 142 between the conductive layers 162 is exposed accordingly. According to some embodiments of the present disclosure, the etchant used to etch the conductive material 163 or 161 is selective to the conductive material 163 or 161 with respect to the material of the etch stop layer 165 or the dielectric layer 142 such that the etching can stop on the dielectric layer 142.

Figure 1N:
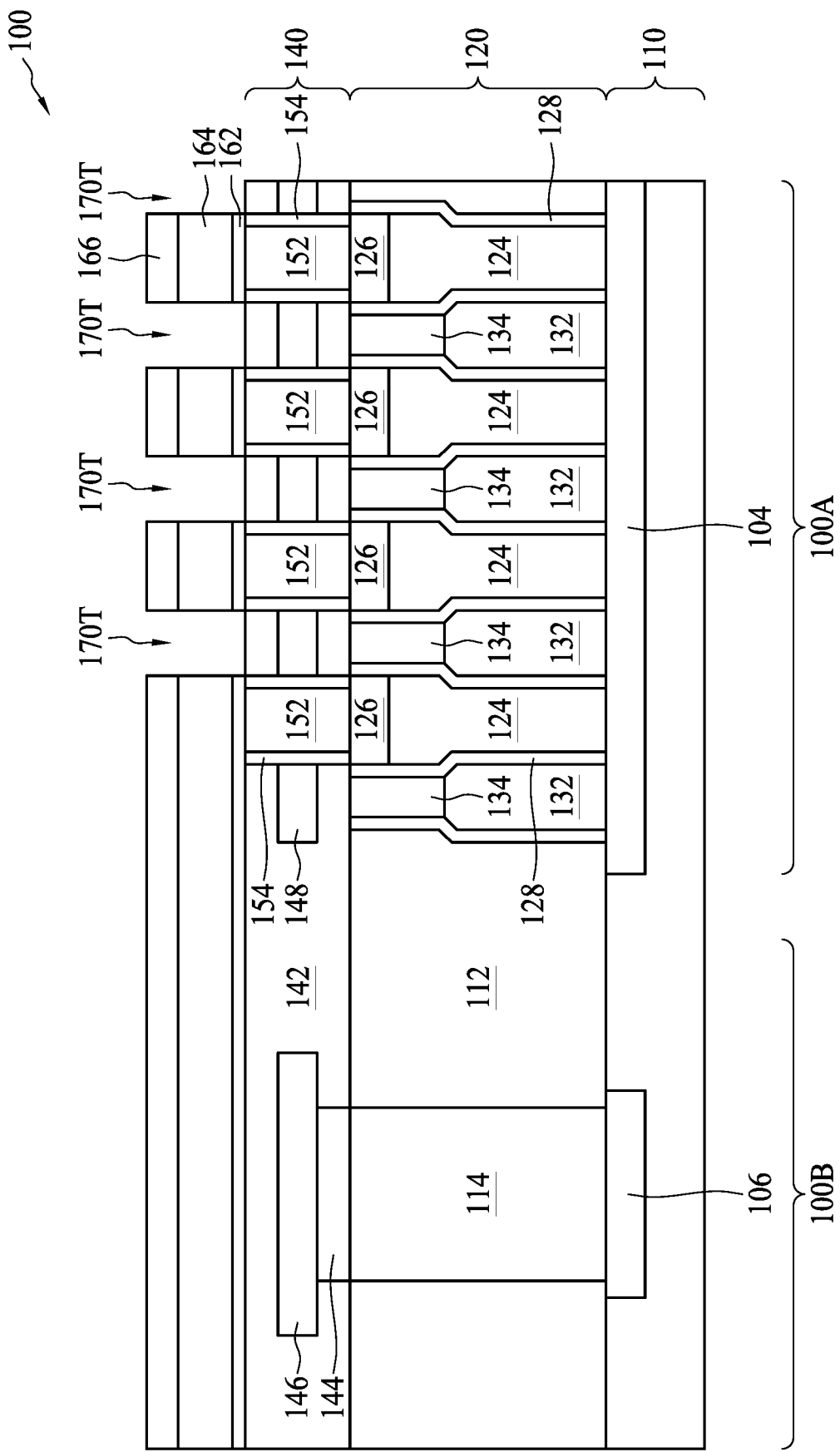
Figure 10:
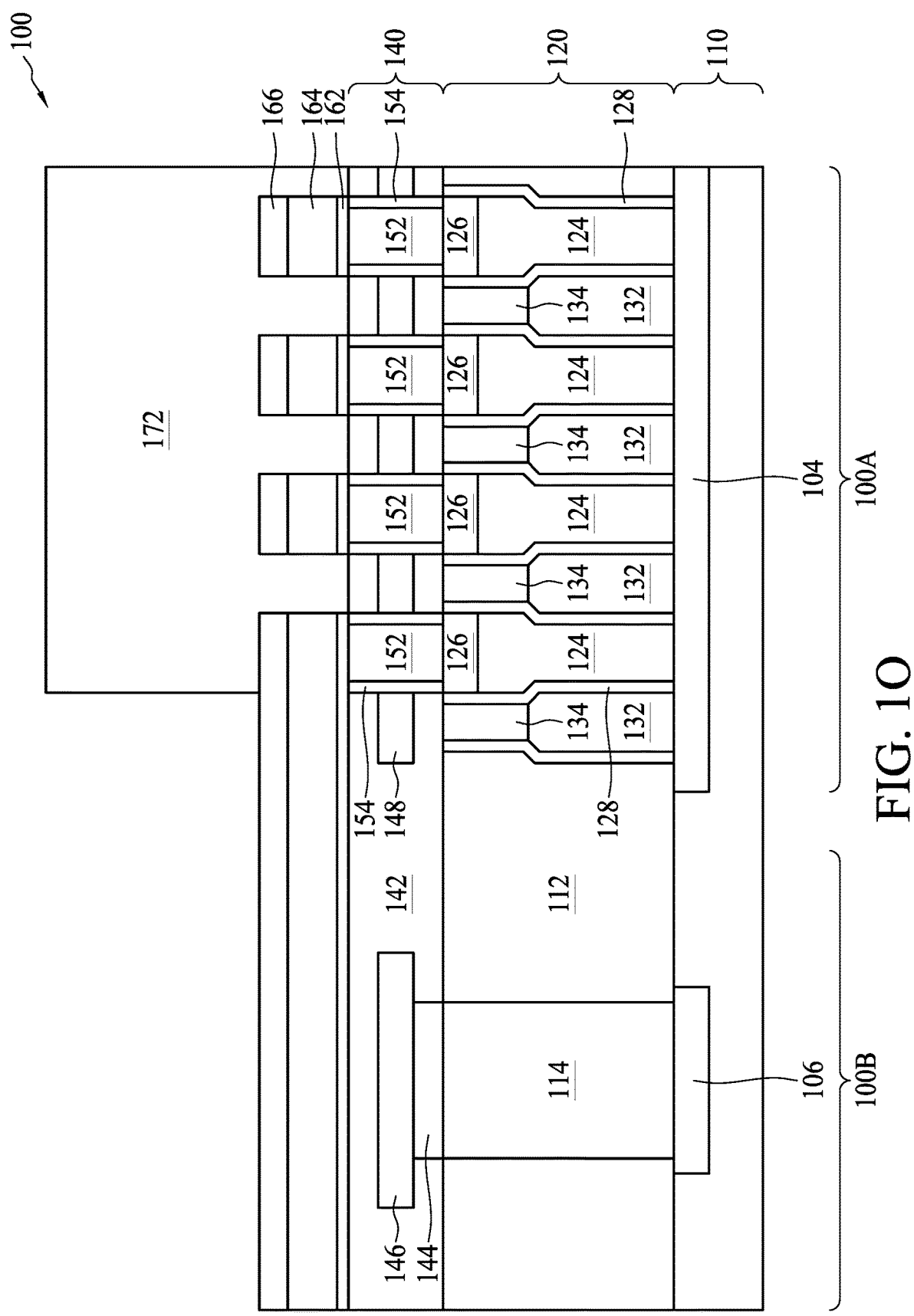

Referring to FIG. 1N, the patterned photoresist 170 is removed or stripped after the patterning of the conductive pads 161 and 163 is completed. According to some embodiments of the present disclosure, the patterned hard mask layer 168 is also removed or stripped. The removal of the patterned the photoresist 170 and the patterned hard mask layer 168 may include a dry etch, a wet etch, an RIE, an ashing operation, or the like. As a result, the upper surface of the patterned etch stop layer 166 is exposed.

Referring to FIG. 1O, a photoresist 172 is provided to cover the first region 110A. The second region 110B is exposed accordingly. The photoresist 172 may be deposited over the first region 110A by CVD, PVD, spin-on coating, or other suitable deposition methods. According to some embodiments of the present disclosure, the photoresist 172 includes a single-layer structure of a multilayer structure.

Figure 1P:
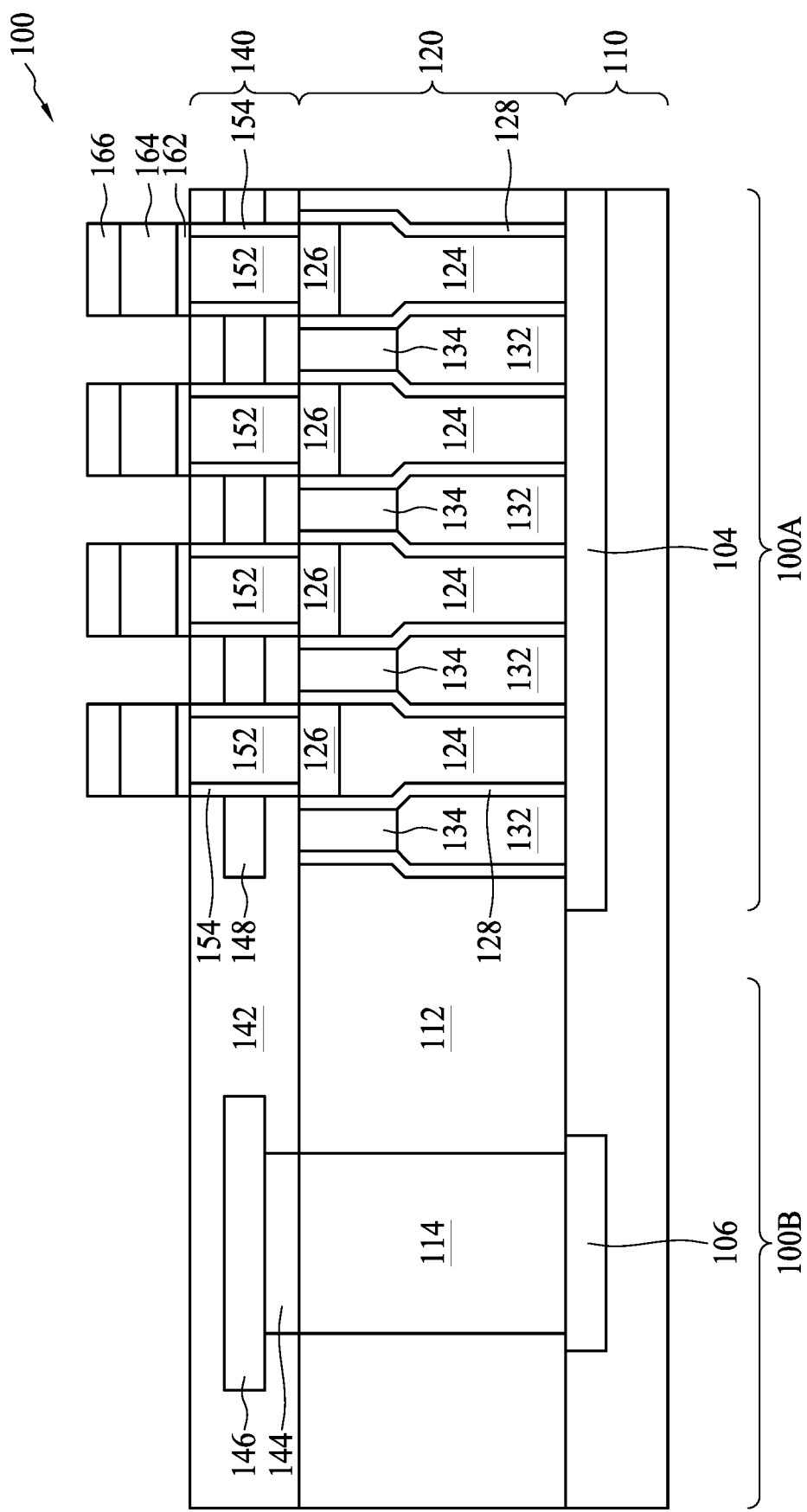

Referring to FIG. 1P, portions of the patterned etch stop layer 166, the conductive material 163 and the conductive material 161 left in the second region 110B are removed. The removal operation may be performed by an etching operation using the photoresist 172 as an etching mask. The etching operation may include a dry etch, a wet etch, an RIE or the like. As a result, the upper surface of the dielectric layer 142 of the second region 110B is exposed. According to some embodiments of the present disclosure, after the etching operation is completed, the photoresist 172 is stripped or removed. The etch stop layer 166 and the dielectric layer 142 in the first region 110A is exposed again.

Figure 1Q:
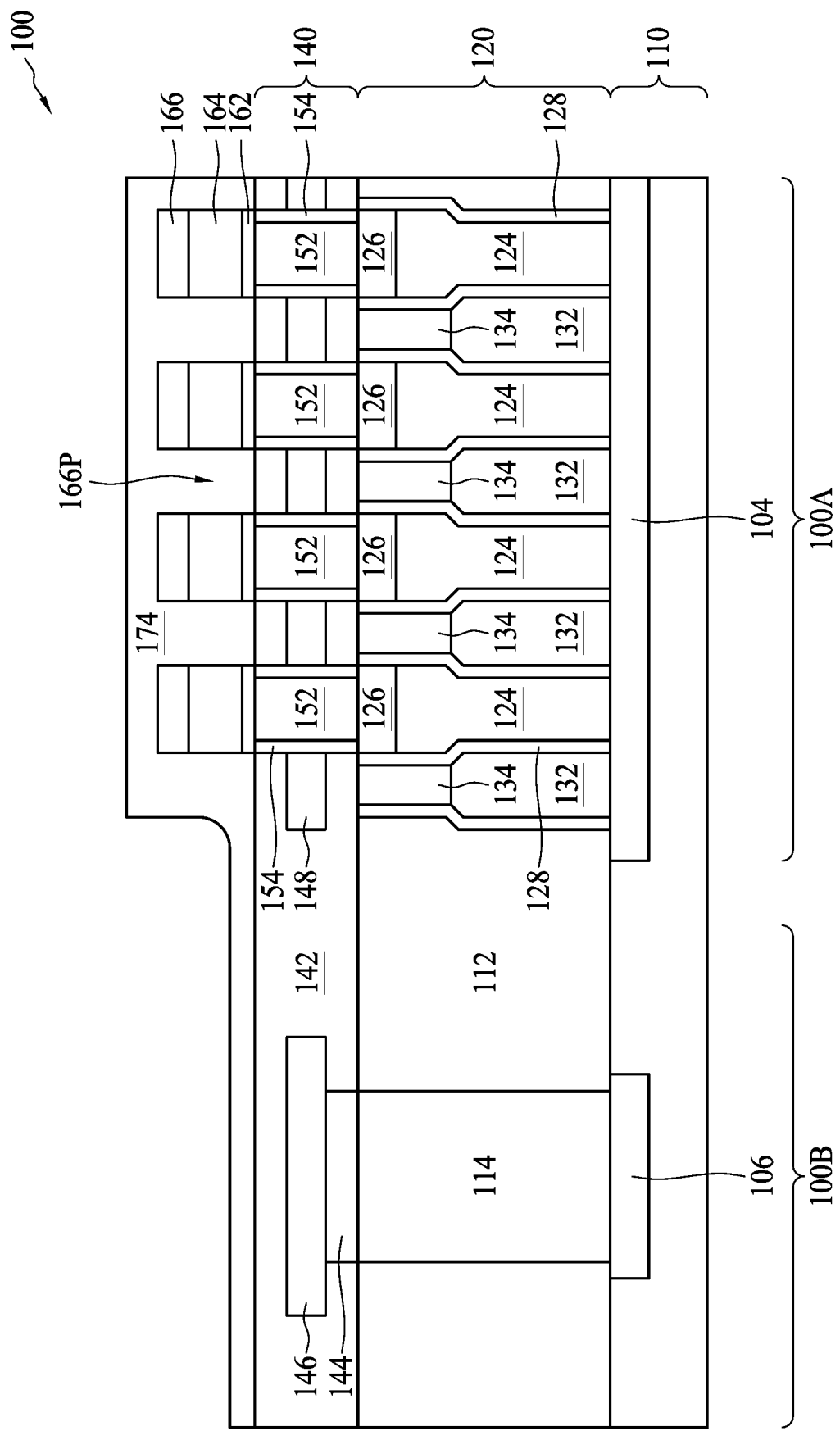

FIG. 1Q shows the formation of a dielectric layer 174 over the dielectric layer 142 and the conductive pads 164. The dielectric layer 174 may extend across the first region 110A and the second region 110B. According to some embodiments of the present disclosure, the dielectric layer 174 covers the patterned etch stop layer 166 and fills spaces 166P between the adjacent conductive layers 162, between the adjacent conductive pads 164, and between the adjacent portions of the patterned etch stop layer 166. The deposited dielectric layer 174 covers the entirety of the patterned etch stop layer 166 in the first region 110A and the upper surface of the dielectric layer 142 in the second region 110B. The dielectric layer 174 also contacts the upper surface of the dielectric layer 174 in the first region 110A. The dielectric layer 174 may include a dielectric material, e.g., silicon oxide, different from that of the patterned etch stop layer 166. The dielectric layer 174 may be formed by ALD to improve the gap-filling performance in the spaces 166P; however, other deposition methods such as PVD or CVD may also be used.

Figure 1R:
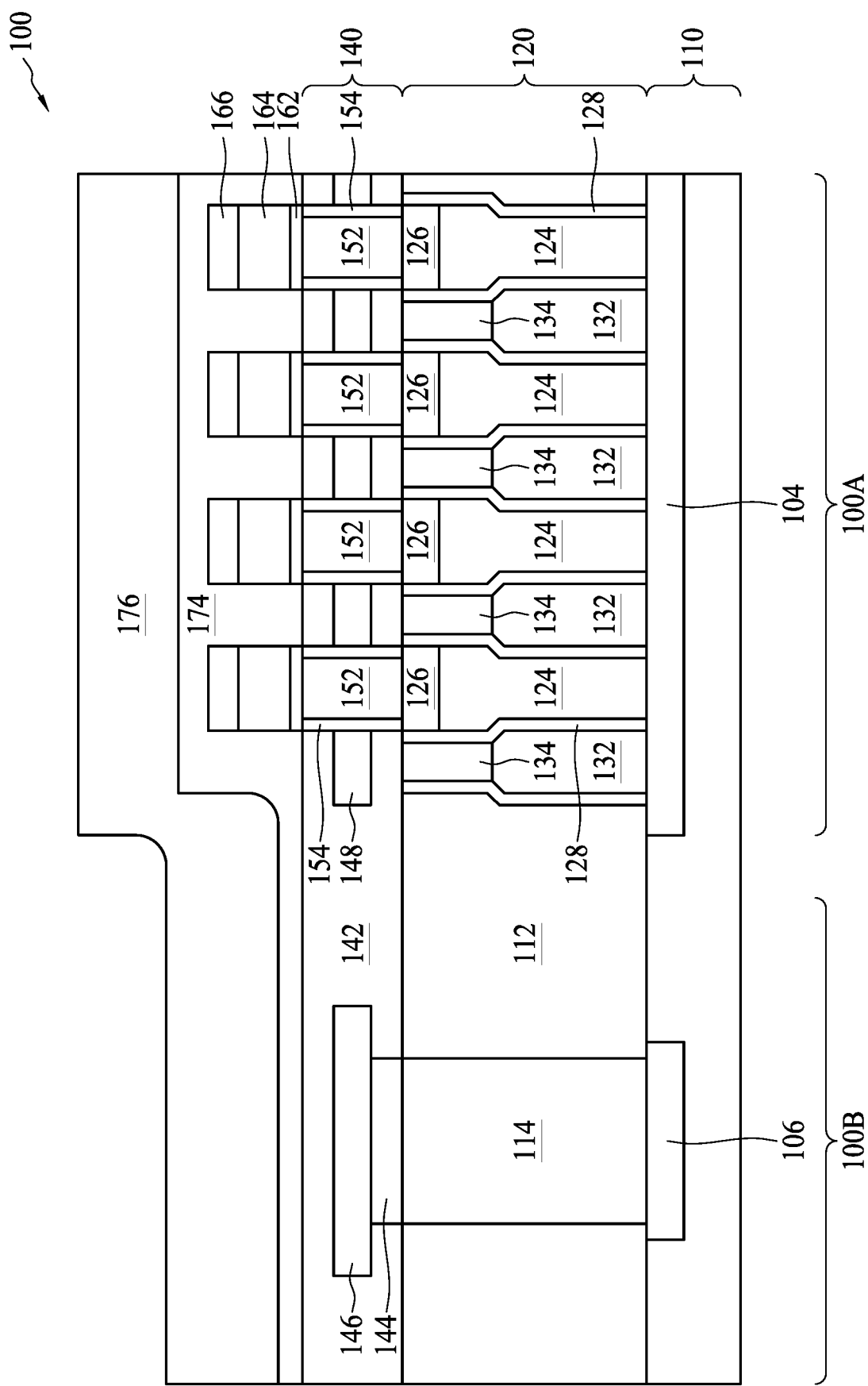

Referring to FIG. 1R, another dielectric layer 176 is deposited over the dielectric layer 174. The dielectric layer 176 may extend across the first region 110A and the second region 110B. According to some embodiments of the present disclosure, the dielectric layer 176 covers the dielectric layer 174. The dielectric layer 176 may include a dielectric material, e.g., silicon oxide, different from that of the patterned etch stop layer 166. The dielectric layer 176 may include a material, e.g., silicon oxide, similar to that of the dielectric layer 174. The dielectric layer 176 may be formed by CVD, PVD, ALD, spin-on coating, or other suitable deposition methods.

Figure 1S:
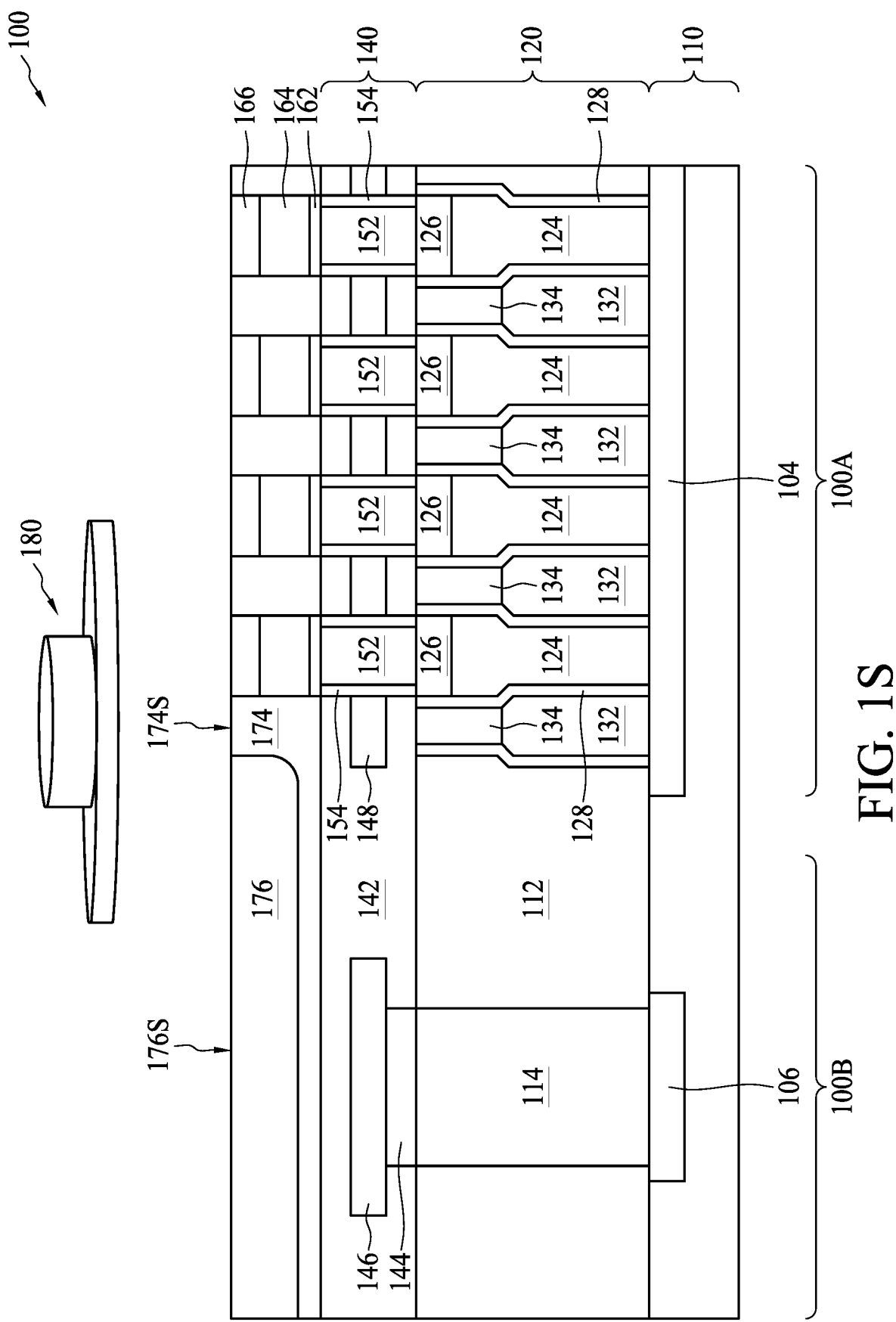

Referring to FIG. 1S, a planarization operation is performed by a tool 180. According to some embodiments of the present disclosure, the planarization operation includes CMP. As a result, a portion of the dielectric layer 176 and a portion of the dielectric layer 174 are thinned or removed. According to some embodiments of the present disclosure, the tool 180 includes a polishing pad configured to remove a thickness of the dielectric layer 174 or the dielectric layer 176. Since the material of the etch stop layer 166 is different from, e.g., harder than, the materials of the dielectric layers 174 and 176, the planarization operation may stop at the etch stop layer 166 during the thinning of the dielectric layers 174, 176. Therefore, an upper surface of each of the patterned etch stop layer 166 is exposed during the planarization operation. The upper surface of the etch stop layer 166 may be substantially leveled with the upper surface 174S of the dielectric layer 174 and the upper surface 176S of the dielectric layer 176 with a surface roughness caused by the polishing pad. According to some embodiments of the present disclosure, a slight thickness of the etch stop layer 166 may be consumed during the planarization operation, but the etch stop layer 166 will not be fully removed during the planarization operation such that the underlying conductive pads 164 can be well protected, i.e., the upper surfaces of the conductive pads 164 are covered during the planarization operation.

Figure 1T:
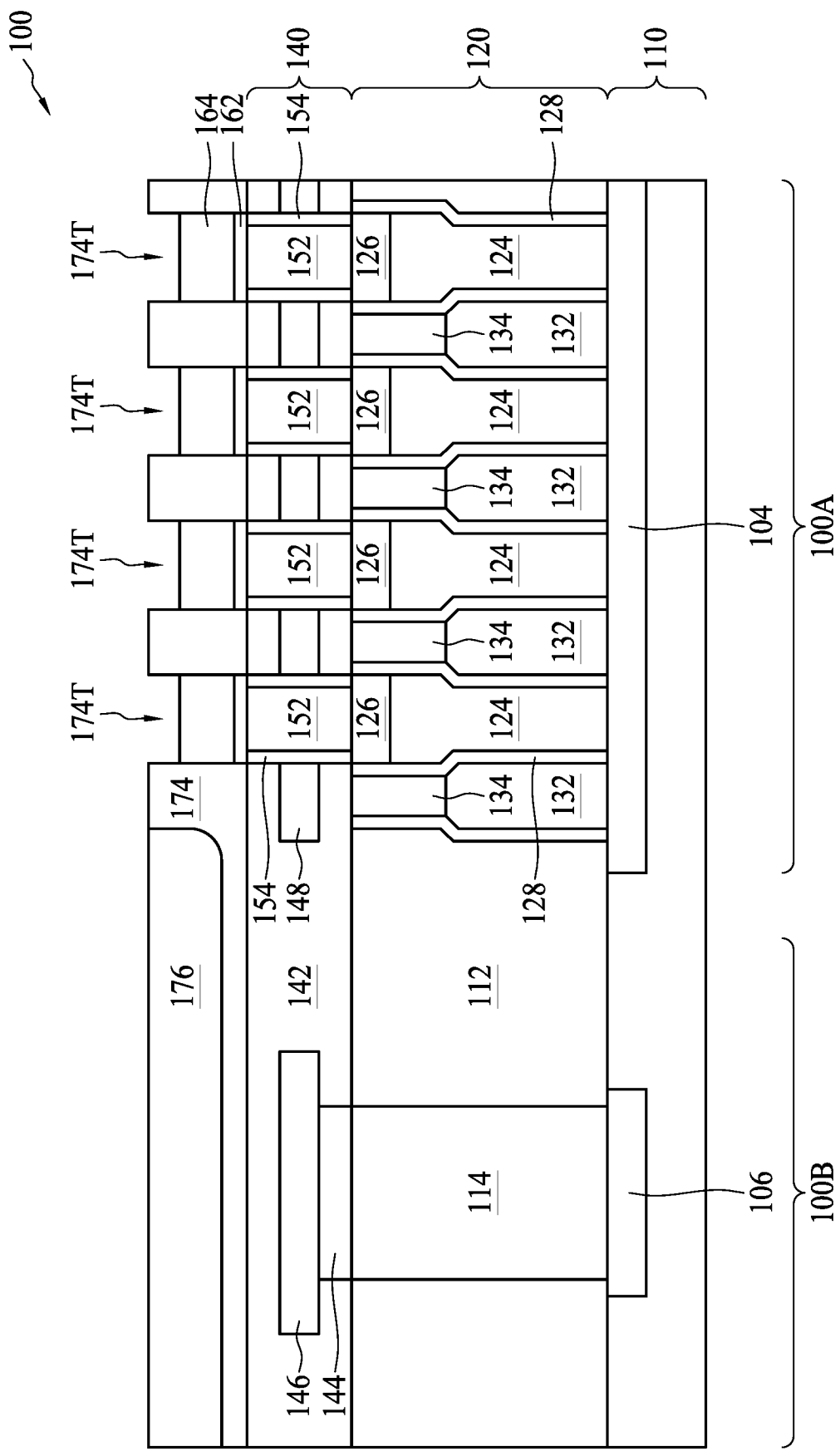

Referring to FIG. 1T, the etch stop layer 166 is removed from the upper surface of the conductive pads 164. The removal of the etch stop layer 166 may include a dry etch, a wet etch, an RIE, or the like. The upper surface of the conductive pads 164 are exposed accordingly. The etchants of the etching operation may be selective to the etch stop layer 166 with respect to the dielectric layers 174, 176 and the conductive pads 164 such that the dielectric layers 174, 176 and the conductive pads 164 are kept substantially intact during the etching of the etch stop layer 166. Therefore, trenches 174T are formed within the dielectric layer 174 over the conductive pads 164.

Figure 1U:
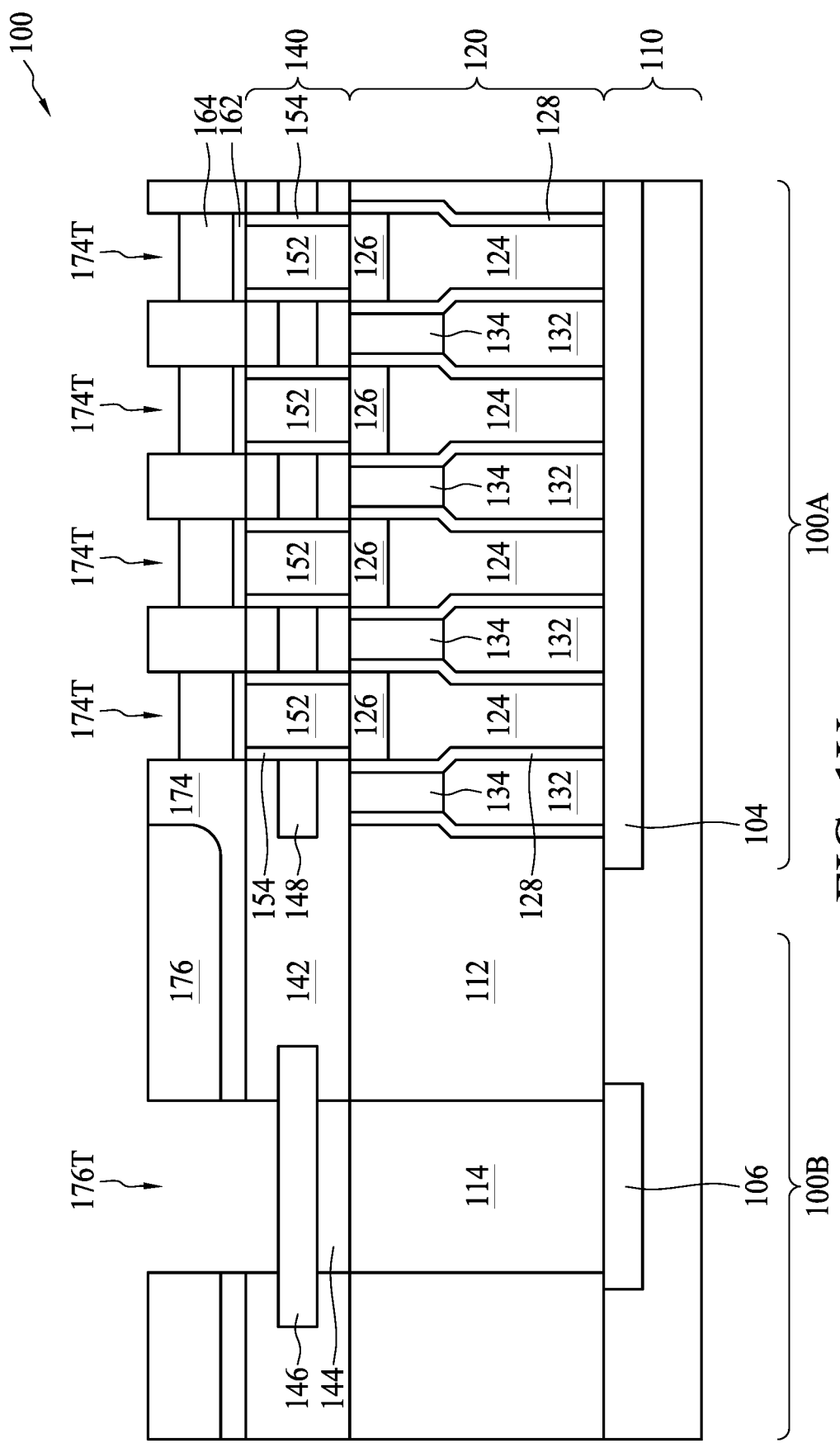

Referring to FIG. 1U, a via 176T is formed in the second region 110B over the conductive line 146. The via 176T extends through the dielectric layer 176, the dielectric layer 174, and the dielectric layer 142, and exposes the underlying conductive line 146. The via 176T may be formed by photolithography and etching operations. The etching operation may include a dry etch, a wet etch, an RIE or the like. The etching operation may include an anisotropic etch.

Figure 1V:
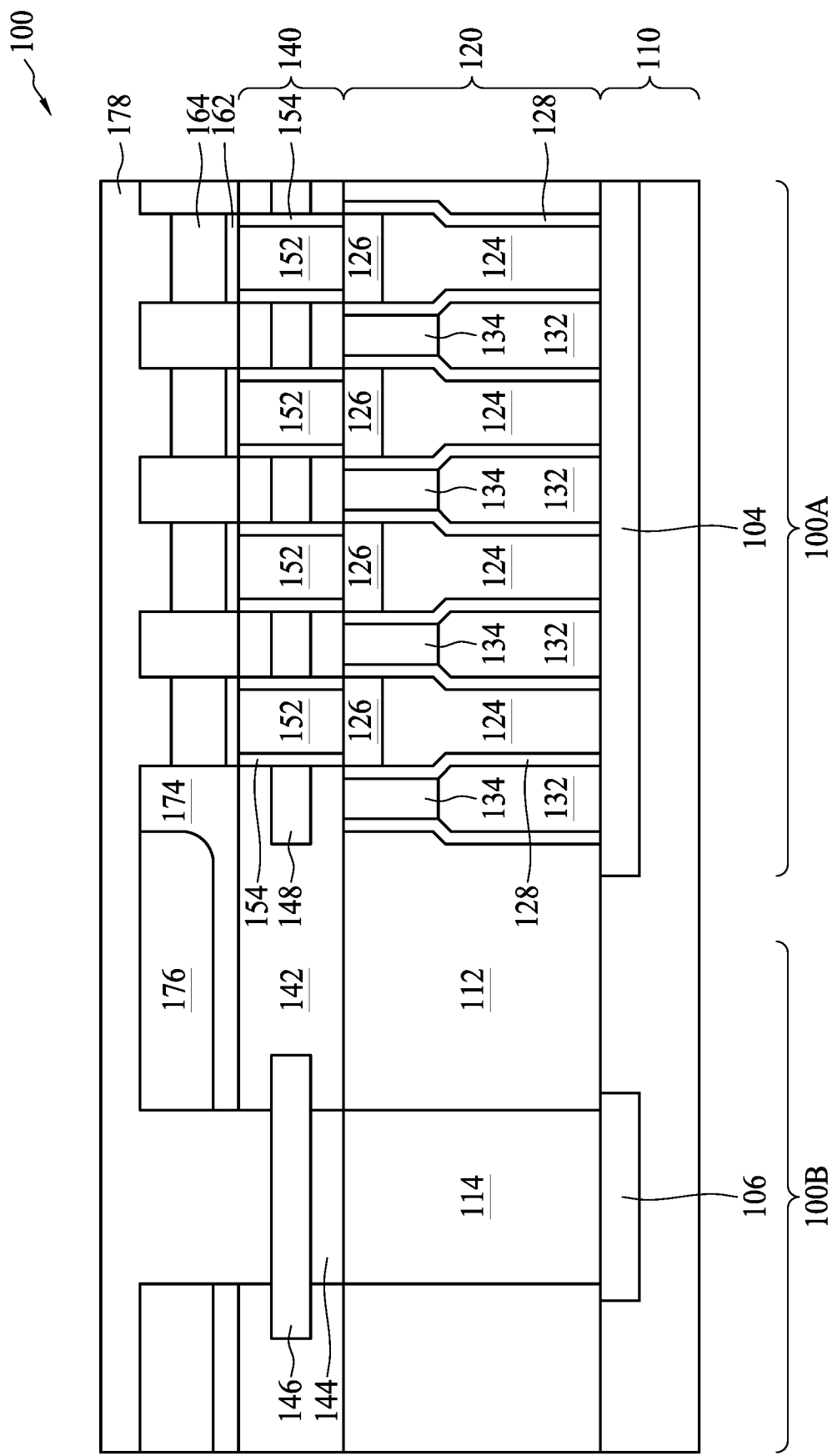

Referring to FIG. 1V, a conductive material 178 is deposited over the dielectric layer 174 and the dielectric layer 176 and fills the trenches 174T and the via 176T. According to some embodiments of the present disclosure, the conductive material 178 extends over the surface of the dielectric layers 174 and 176. The conductive material 178 may be the same as the material of the conductive pads 164, e.g., tungsten, or other conductive material such as copper, aluminum, silver, gold, titanium, titanium nitride, tantalum, tantalum nitride, alloys thereof. The deposition of the conductive material 178 may be performed by CVD for facilitating the gap filling performance of the conductive material 178 in the trenches 174T and 176T.

Figure 1W:
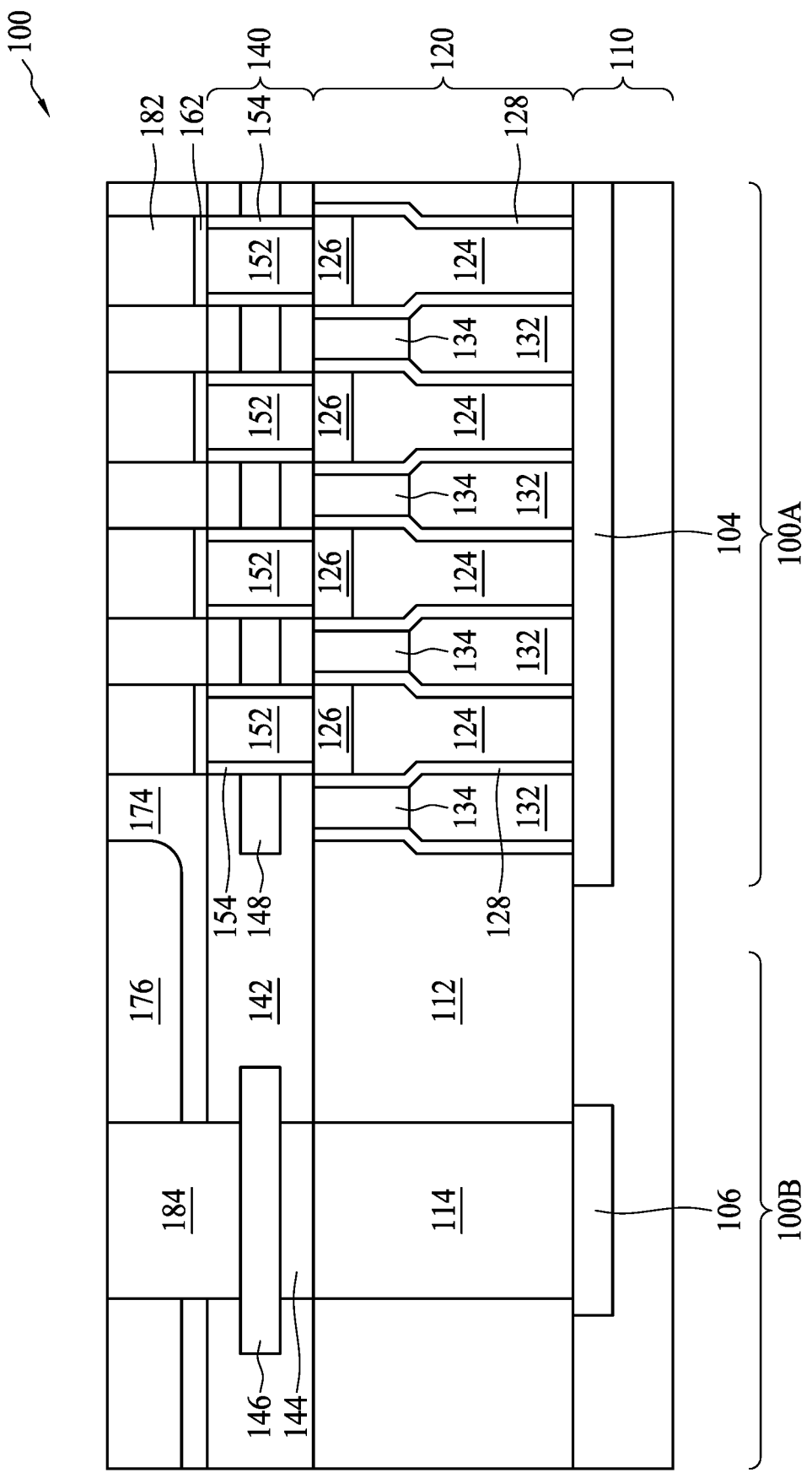

Referring to FIG. 1W, the excess portions of the conductive material 178 is removed by a planarization operation, e.g., CMP or mechanical grinding. The upper surfaces of the dielectric layers 174 and 176 are exposed again during the planarization operation. The heights of the original conductive pads 164 are increased to form conductive pads 182, in which the conductive pads 182 include upper surfaces leveled with the upper surface of the dielectric layer 174 or the dielectric layer 176. Furthermore, according to some embodiments of the present disclosure, the planarization operation form a conductive via 184 in the second region 110B, in which the upper surface of the conductive via 184 is leveled with the upper surface of the dielectric layer 174 or the dielectric layer 176. The conductive via 184 may be electrically coupled to the underlying conductive line 146.

Figure 1X:
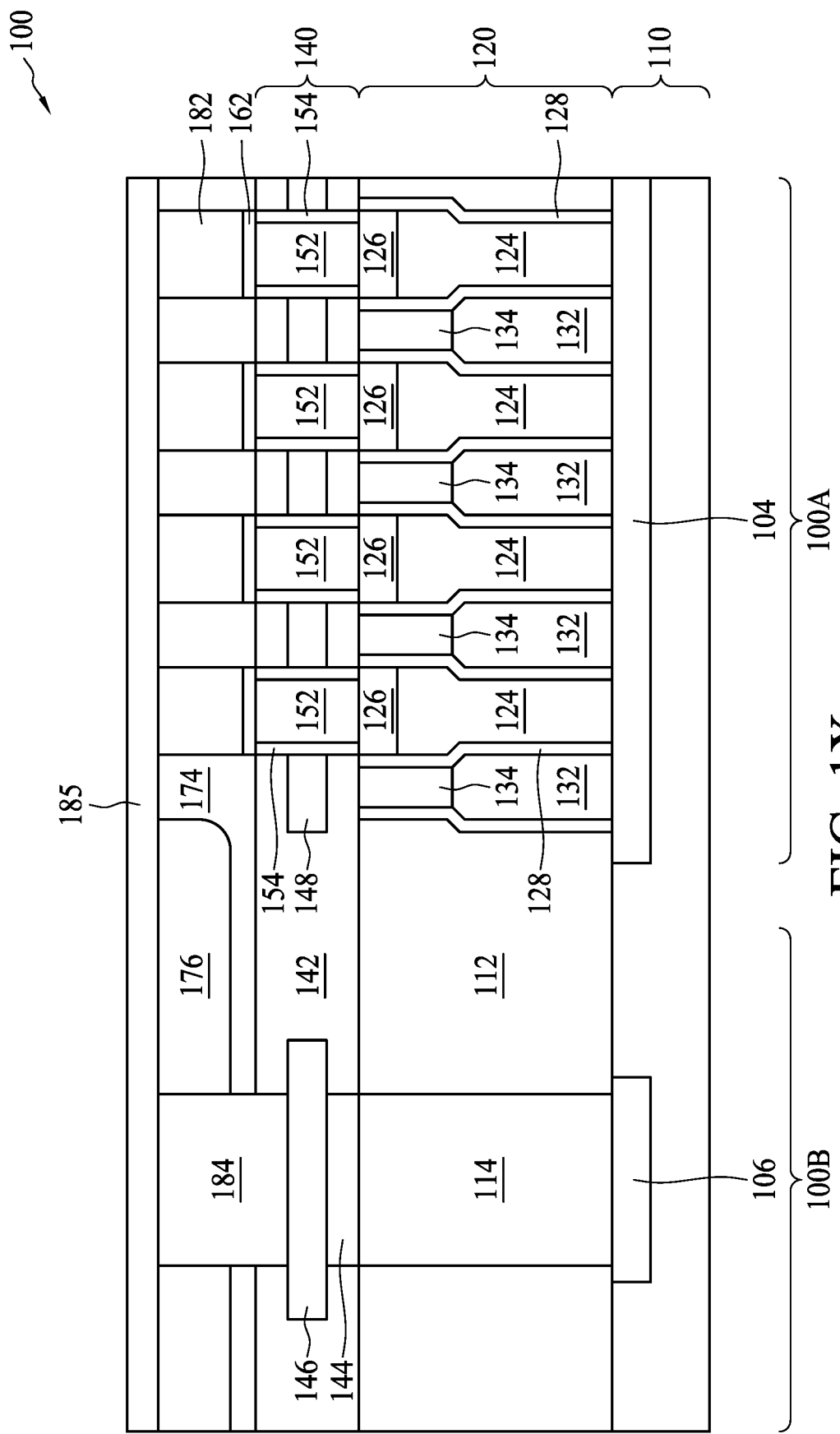

Referring to FIG. 1X, a conductive layer 185 is formed over the dielectric layers 174, 176, the conductive pads 182 and the conductive via 184. The conductive layer 185 may be the same as the material of the conductive pads 164 or the conductive material 178, e.g., tungsten, or other conductive material such as copper, aluminum, silver, gold, titanium, titanium nitride, tantalum, tantalum nitride, alloys thereof. The deposition of the conductive material 185 may be performed by PVD for improving the electrical or mechanical properties of the conductive layer 185. According to some embodiments of the present disclosure, a planarization operation, e.g., CMP, is performed to planarize the surface of the conductive layer 185.

Figure 1Y:
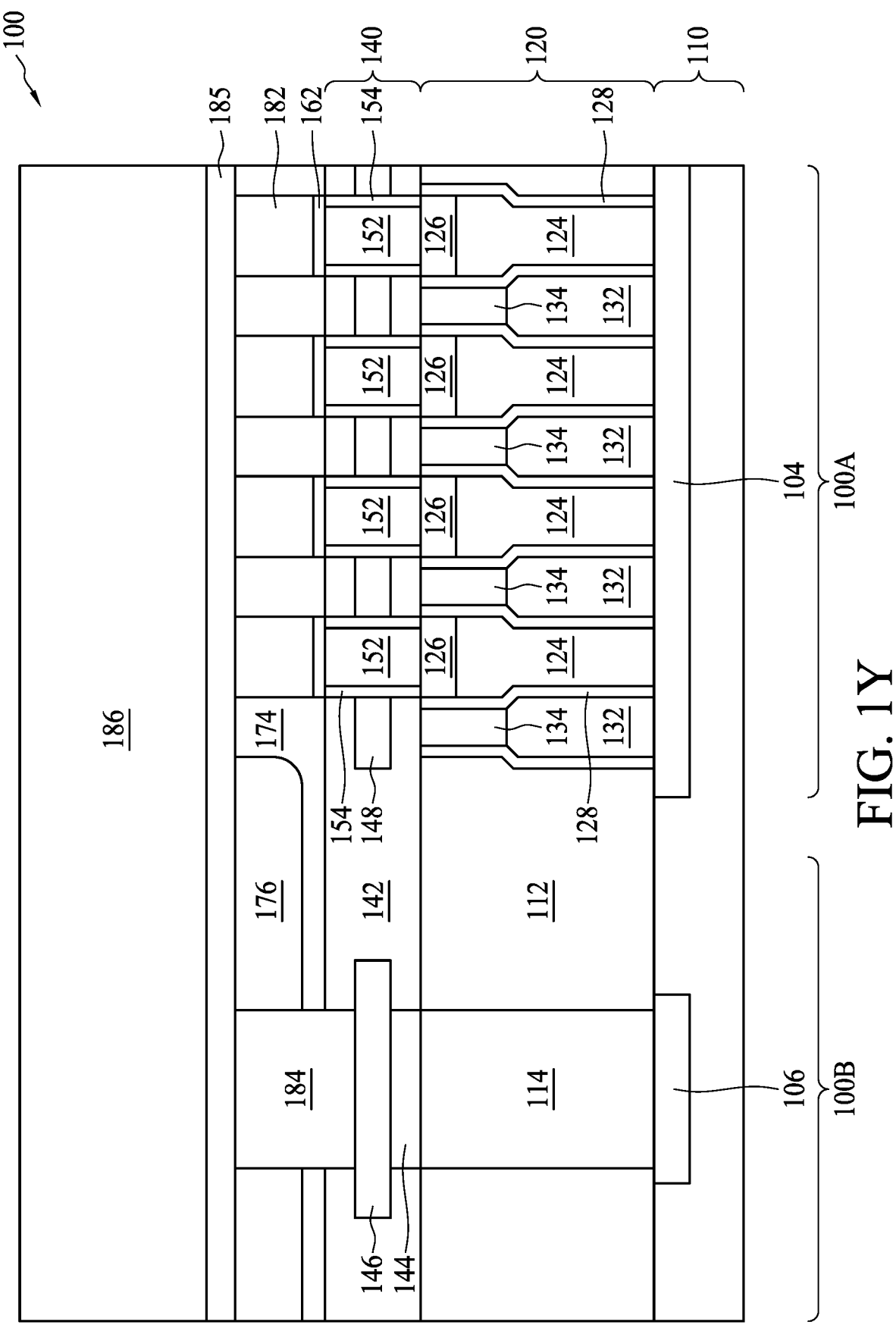

Referring to FIG. 1Y, a dielectric layer 186 is deposited over the conductive layer 185. The dielectric layer 186 may include a dielectric material, e.g., silicon oxide, silicon nitride, silicon carbide, silicon oxynitride, high-k dielectric materials, or other suitable dielectric materials. The dielectric layer 186 may be a single layer structure or a multilayer structure formed of sublayers of various dielectric materials. The dielectric layer 186 may be formed by deposition, such as CVD, PVD, ALD, spin-on coating, or other suitable deposition methods.

Figure 1Z:
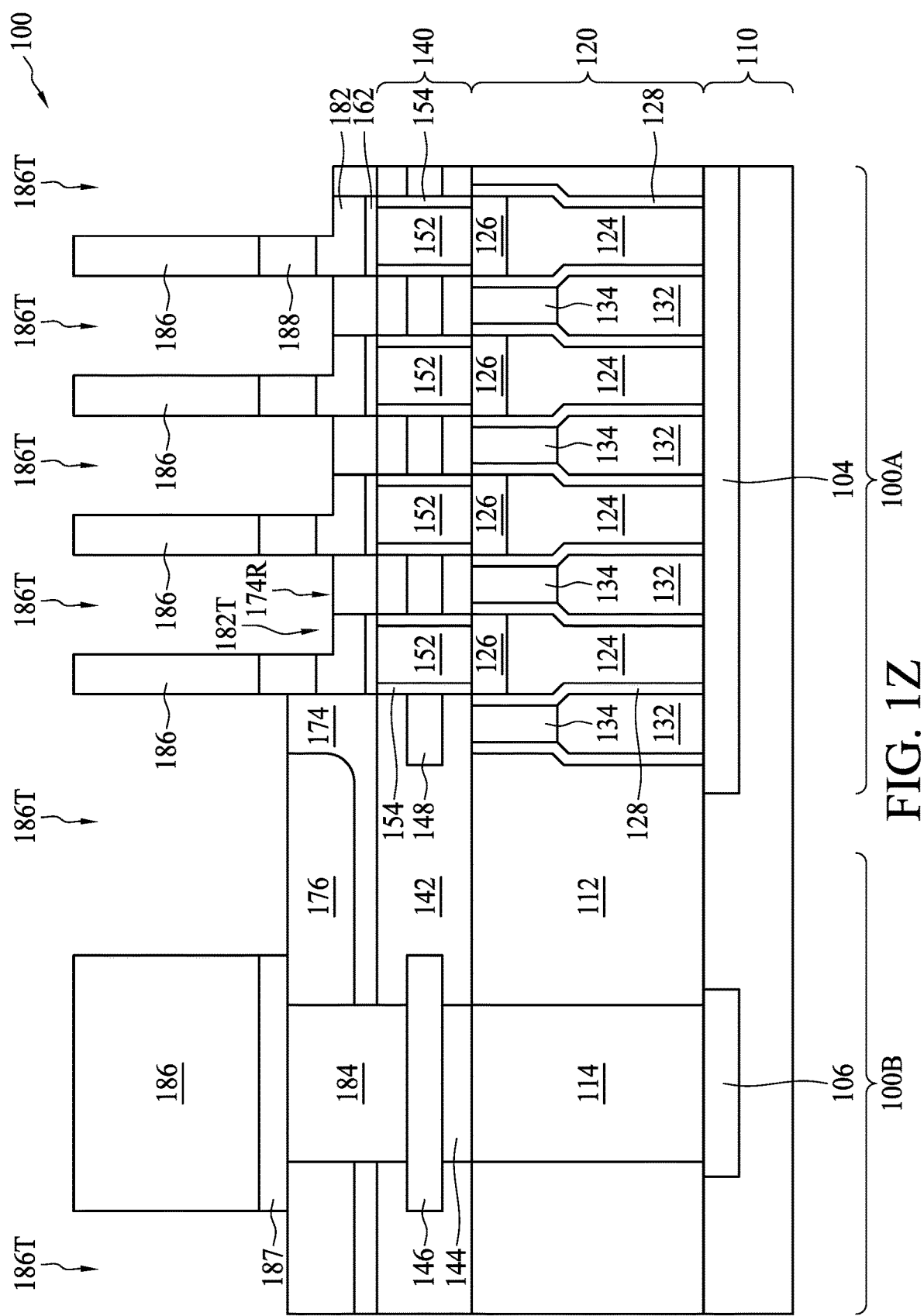
Figure 1A:
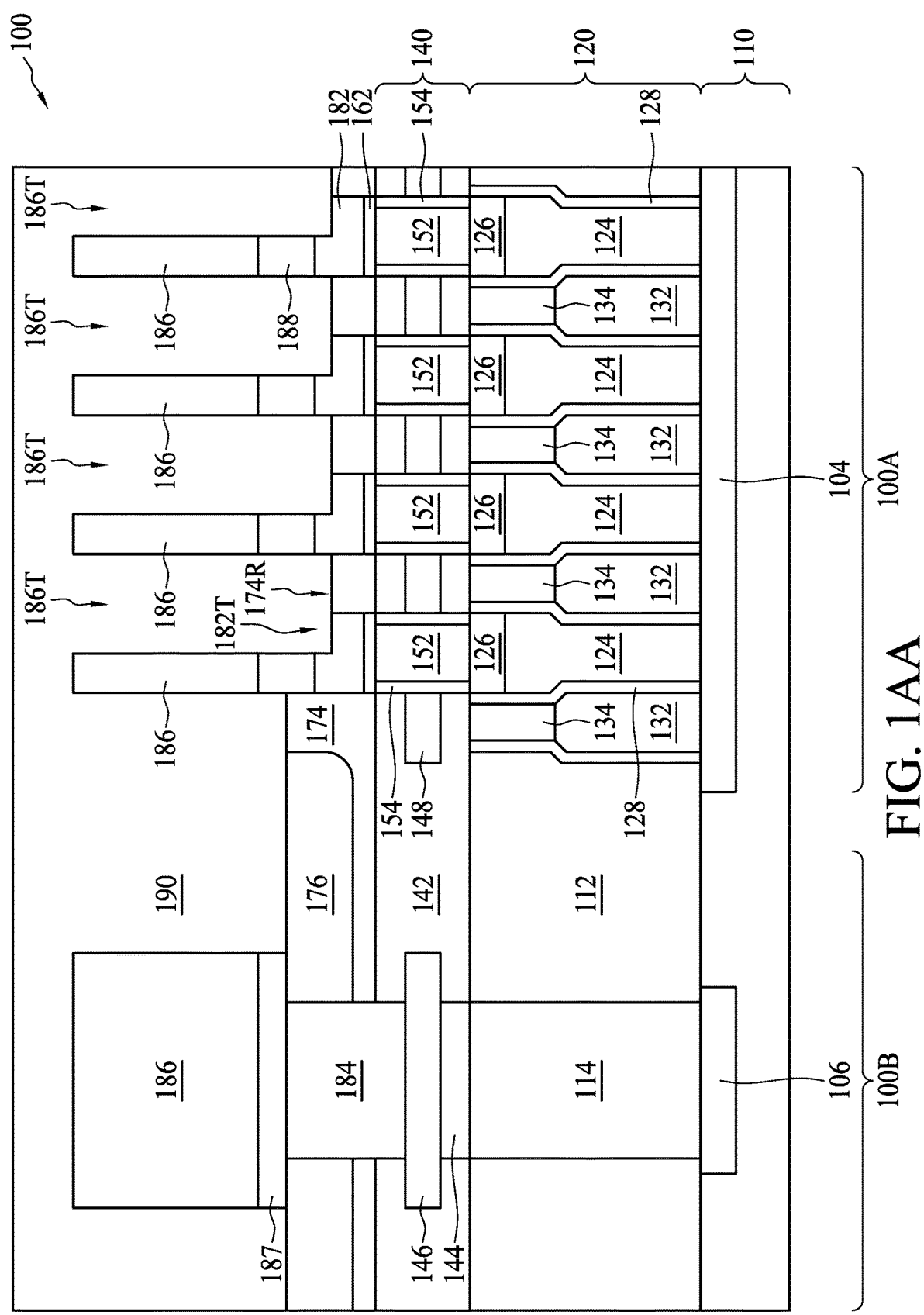
Figure 1A:
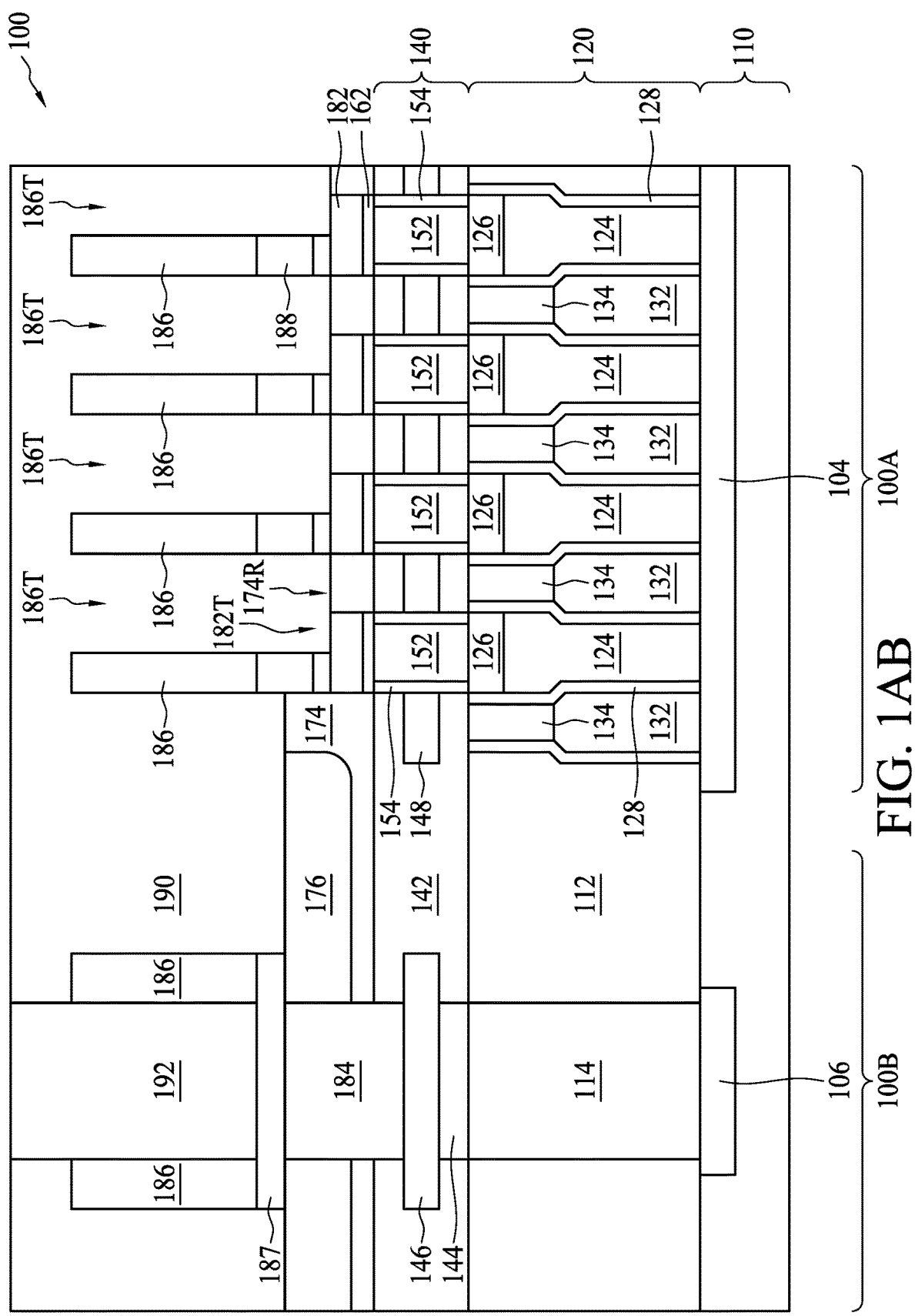

Referring to FIG. 1Z, a patterning operation is performed on the dielectric layer 185 to form trenches 186T through the dielectric layer 186. The trenches 186T extends further into the dielectric layer 174, the conductive layer 185 and the conductive pads 182. A conductive pad 187 is thus formed over the conductive via 184. According to some embodiments of the present disclosure, the conductive pad 187 has a width or surface area greater than that of the conductive via 184. According to some embodiments of the present disclosure, the patterning operation removes portions of the conductive pads 182 to form bit lines 188 over the conductive pads 182. A portion 182T of the conductive pad 182 and a portion 174R of the dielectric layer 174 are etched through the patterning operation to form the bit lines 188 and the conductive pads 182. According to some embodiments of the present disclosure, the remaining portions of the dielectric layer 174 laterally surround the conductive pads 182.

Although not shown, it is understood that the conductive pads 182 are formed over the channel layers 152 of the corresponding storage units 124, while each of the bit lines 188 is formed as a conductive line extending in the direction coming out of the sheet of FIG. 1Z to be electrically coupled to the individual channel layers 152. Further, each portion of the dielectric layer 174 between adjacent conductive pads 182 may be lower than the surface of the dielectric layer 176 from a cross-sectional view. An interface between the dielectric layer 174 and the conductive pads 182 may be exposed. The trench 186T may be formed by photolithography and etching operations. The etching operation may include a dry etch, a wet etch, an RIE or the like. The etching operation may include an anisotropic etch.

Referring to FIG. 1AA, a dielectric layer 190 is deposited over the dielectric layers 174, 176, 186, the bit lines 188 and the conductive pads 182. The dielectric layer 190 may fills the trenches 186T. The dielectric layer 190 may include a dielectric material, e.g., silicon oxide, silicon nitride, silicon carbide, silicon oxynitride, high-k dielectric materials, or other suitable dielectric materials. The dielectric layer 190 may be a single layer structure or a multilayer structure formed of sublayers of various dielectric materials. The dielectric layer 190 may be formed by deposition, such as CVD, PVD, ALD, spin-on coating, or other suitable deposition methods.

Referring to FIG. 1AB, a trench (not separately shown) is formed through the dielectric layer 190 and the dielectric layer 186 over the conductive pad 187 to expose the conductive pad 187. A conductive material is deposited in the trench to form a conductive via 192 to be electrically coupled to the conductive pad 187. The conductive via 192 may be the same as the material of the conductive pads 164, the bit lines 188 or the conductive pad 187, e.g., tungsten, or other conductive material such as copper, aluminum, silver, gold, titanium, titanium nitride, tantalum, tantalum nitride, alloys thereof. The deposition of the conductive material for the conductive via 192 may be performed by CVD for improving the gap filling performance. According to some embodiments of the present disclosure, a planarization operation, e.g., CMP, is performed to remove excess materials of the conductive via 192 and planarize the surface of the conductive via 192.

FIG. 2 is a schematic top view of the semiconductor structure 100, in accordance with various embodiments of the present disclosure. The schematic cross-sectional views shown in FIGS. 1A to 1AA are taken from sectional line AA of FIG. 2. Some features of the semiconductor structure 100 are omitted from FIG. 2 to better illustrate the components intended to be shown. Referring to FIG. 2, the active regions 104 in the substrate 102, the word lines 148, and the bit lines 188 are shown. According to some embodiments of the present disclosure, the word lines 148 crosses the bit lines 188 from the top-view perspective, and the data storage units 124 (not shown in FIG. 2) is arranged where the word lines 148 cross the bit lines 188 directly over active regions 104. According to some embodiments of the present disclosure, each of the bit lines 188, the word line 148 and a source line (not separately shown) form the control unit of each memory cell, in which the bit line 188 and the source line are respectively coupled to the two electrode plates 114.

FIGS. 3A to 3G are schematic cross-sectional views of intermediate stages of a method 30 of forming a semiconductor structure 300 or 301, in accordance with some comparative embodiments of the present disclosure. It is understood that additional steps can be provided before, during, and after the steps shown by FIGS. 3A to 3G, and some of the steps described below can be replaced or eliminated in additional embodiments of the method 30. The steps may be performed independently, and the order of the steps may be interchangeable. The method 30 shares the manufacturing steps described with reference to FIGS. 1A to 1I, 1O to 1S, and 1X to 1AB of manufacturing the semiconductor structure 100, and these shared steps will not be repeated herein.

Figure 3A:
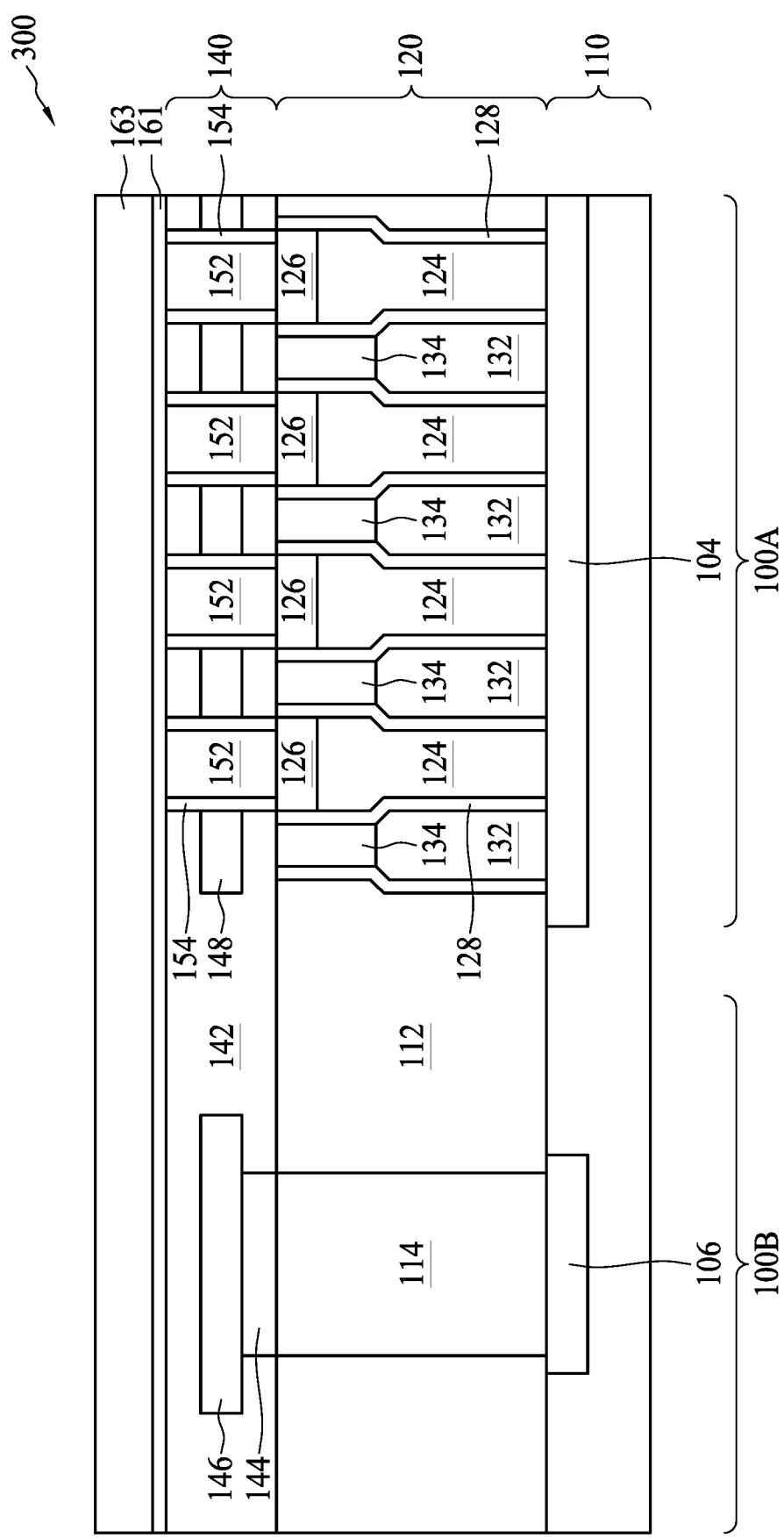
FIGS. 3A to 3G are schematic cross-sectional views of intermediate stages of a method of forming semiconductor structures, in accordance with some comparative embodiments of the present disclosure.
Figure 3B:
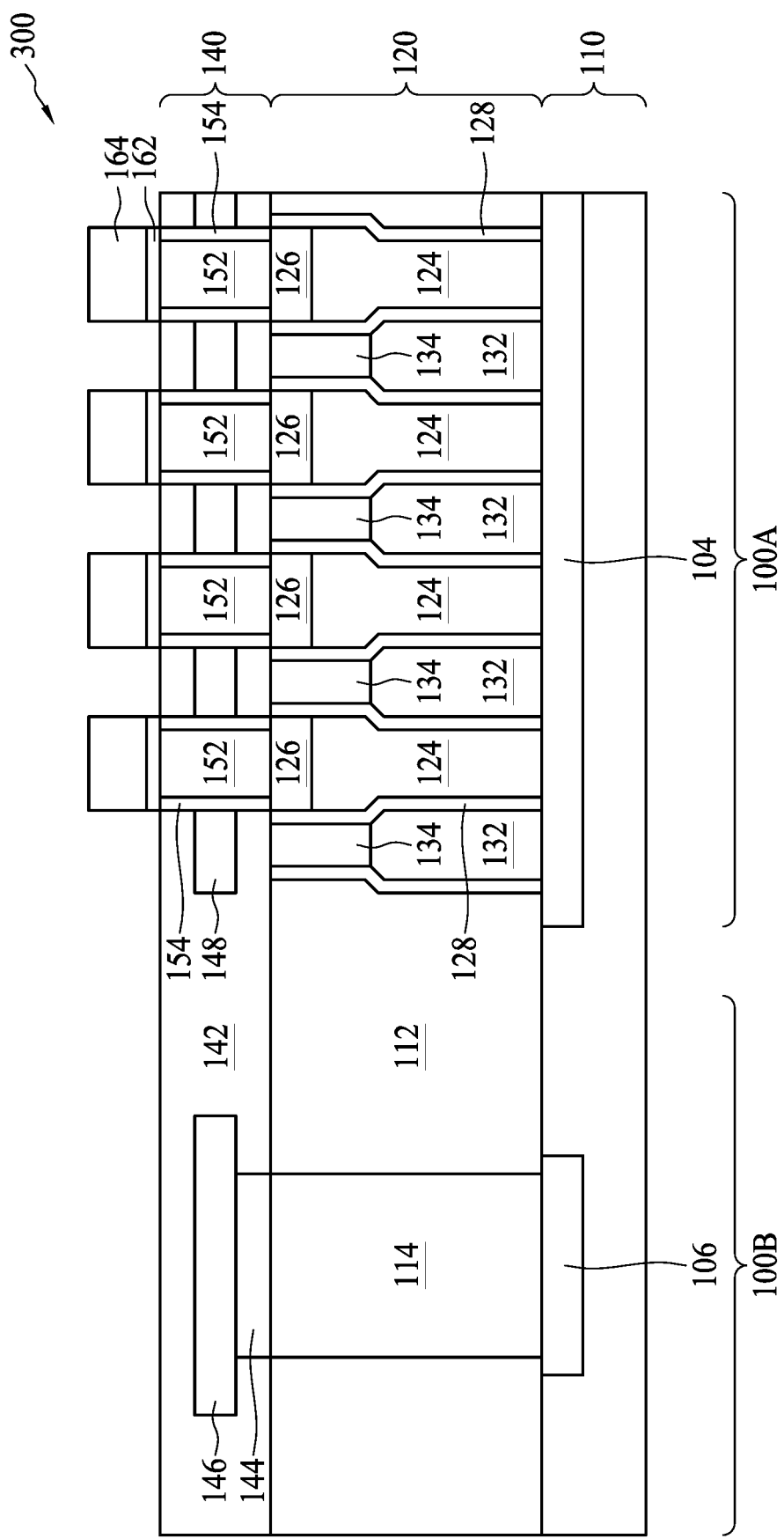

FIGS. 3A to 3E show a scenario of CMP under-polishing in an existing semiconductor structure 300, in accordance with some comparative embodiments of the present disclosure. FIG. 3A shows a cross-sectional view of an intermediate stage of the method 30 for manufacturing a semiconductor structure 300, wherein the step described with reference to FIG. 3A is performed immediately following the stage shown in FIG. 1H and corresponding to the stage shown in FIG. 1I. Referring to FIG. 3A, the conductive materials 163 is deposited over the conductive material 161. Referring to FIG. 3B, a patterning operation is performed on the conductive material 163 and the conductive material 161 to form the conductive pads 164 and the conductive layers 162, respectively. The patterning operation may be performed using photolithography and etching operations, wherein the etching operation includes a dry etch, a wet etch, an RIE, or the like. The photoresist 169 described with reference to FIG. 1L may be utilized in the patterning operation, wherein the photoresist 169 is firstly patterned into the patterned photoresist 170 with the pattern 170P, followed by an etching operation on the conductive materials 163 and 161 to thereby form the array of conductive pads 164 and conductive layers 162. According to some comparative embodiments of the present disclosure, a hard mask layer resembling the hard mask layer 167 may be used. If the hard mask layer 167 formed of carbon is to be used, due to the poor adhesion between carbon of the hard mask layer 167 and the metal, e.g., tungsten, of the conductive material 163, an adhesion layer (not separately shown) may be introduced between the conductive material 163 and the hard mask layer 167. According to some comparative embodiments of the present disclosure, the carbon-based hard mask layer 167 is omitted during the pattering operation.

According to some comparative embodiments of the present disclosure, the etch stop layer 165 is absent from the patterning operation to simplify the manufacturing process. As a result, the upper surfaces of the conductive pads 164 are exposed during the patterning operation, as shown in FIG. 3B. According to some comparative embodiments of the present disclosure, a portion of the upper surface of the dielectric layer 142 between the adjacent conductive layers 162, or between the adjacent conductive pads 164 in the first region 110A is also exposed during the patterning operation.

According to some comparative embodiments of the present disclosure, a photoresist resembling the photoresist 172 described with reference to FIG. 1O is used to cover the first region 110A. The conductive materials 163 and 161 left over the dielectric layer 142 in the second region 110B are then removed using the photoresist 172 as the etching mask, similar to that described with reference to FIG. 1O. As a result, as illustrated in FIG. 3B, an entire upper surface of the dielectric layer 142 in the second region 110B is also exposed.

Figure 3C:
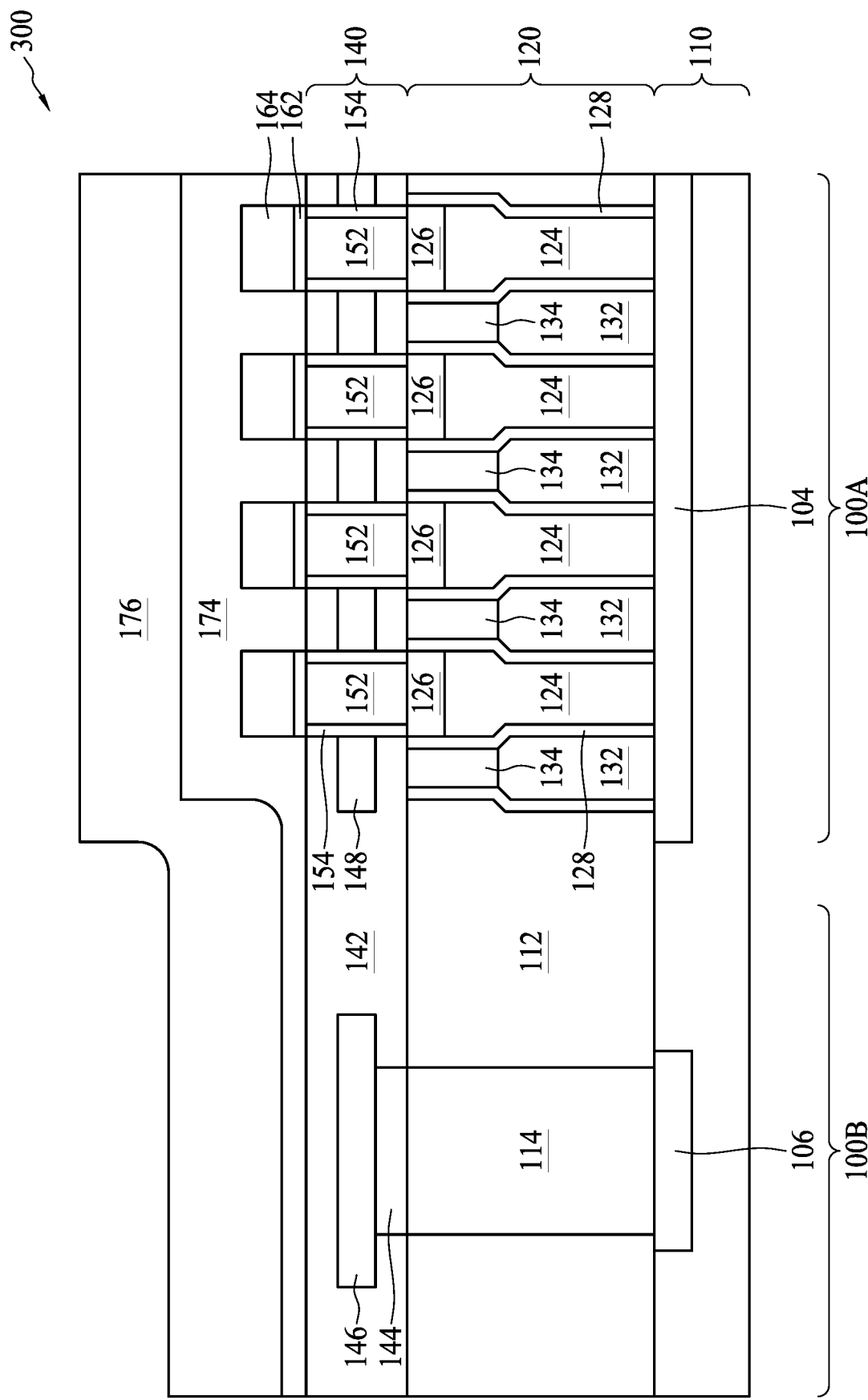

Referring to FIG. 3C, the dielectric layers 174 and 176 are subsequently deposited over the dielectric layer 142 and the conductive pads 164. The materials and methods of forming of the dielectric layers 174, 176 are similar to those described with reference to FIGS. 1Q and 1R, and thus these similar features will not be repeated herein. The semiconductor structure 300 is different from the semiconductor structure 100 mainly in that the dielectric layer 174 is in direct contact with the conductive pads 164 in the absence of the etch stop layer 166 or any other etching stopping structures.

Figure 3D:
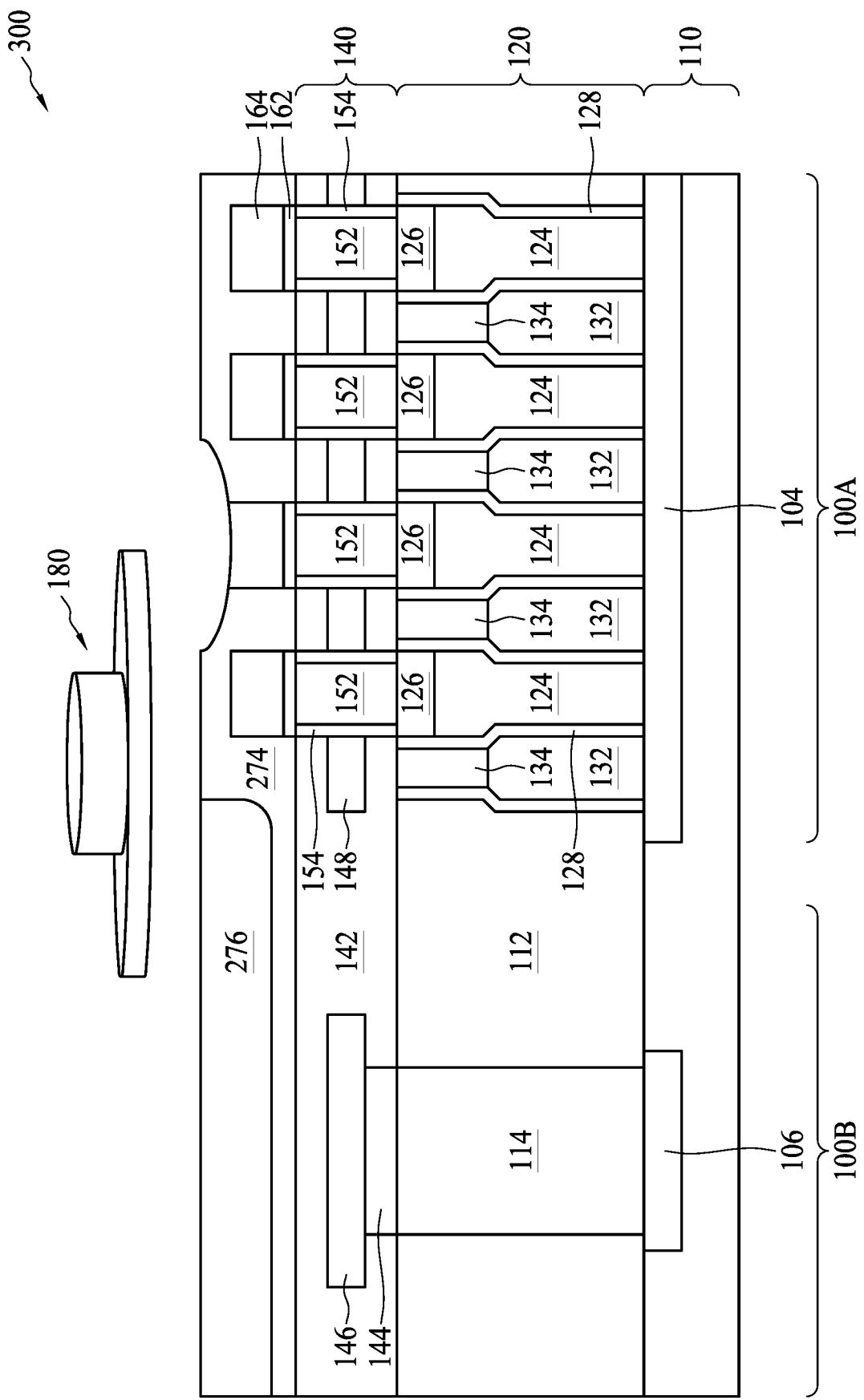

Referring to FIG. 3D, a planarization operation is performed on the semiconductor structure 100, in a manner similar to that described with reference to FIG. 1S. The tool 180 is utilized to perform planarization, e.g., CMP, on the dielectric layers 174 and 176. According to some comparative embodiments of the present disclosure, due to the absence of any etch stop layer between the dielectric layer 174 and the conductive pads 164, the performance of the CMP using the tool 180 may highly rely on the grinding time and the attainable surface uniformity of the tool 180. Since the height of each of the conductive pads 164 is not made large in order to reduce the device size and improve the electrical performance of the semiconductor structure 100, the non-ideal surface uniformity performance of the tool 180 for the conductive pads 164 becomes more noticeable.

Referring to FIG. 3D, after the planarization operation, e.g., CMP, performed by the tool 180, a problem of under-polishing may occur to the surface of the polished dielectric layer 174. The surface roughness of the polished surface of the dielectric layer 174 causes only some (e.g., the second conductive pad 164 from the left shown in FIG. 3D) of the conductive pads 164 being exposed through the dielectric layer 174, while keeping some other conductive pads 164 covered by at least portions of residues of the dielectric layer 174. The under-polishing of the CMP operation may occur not only to the dielectric layer 174 across different semiconductor wafers but also to the different portions of the dielectric layer 174 in the single semiconductor wafer. As a result, the upper surfaces of at least some of the conductive pads 164 are not exposed even after the planarization operation is performed.

Figure 3E:
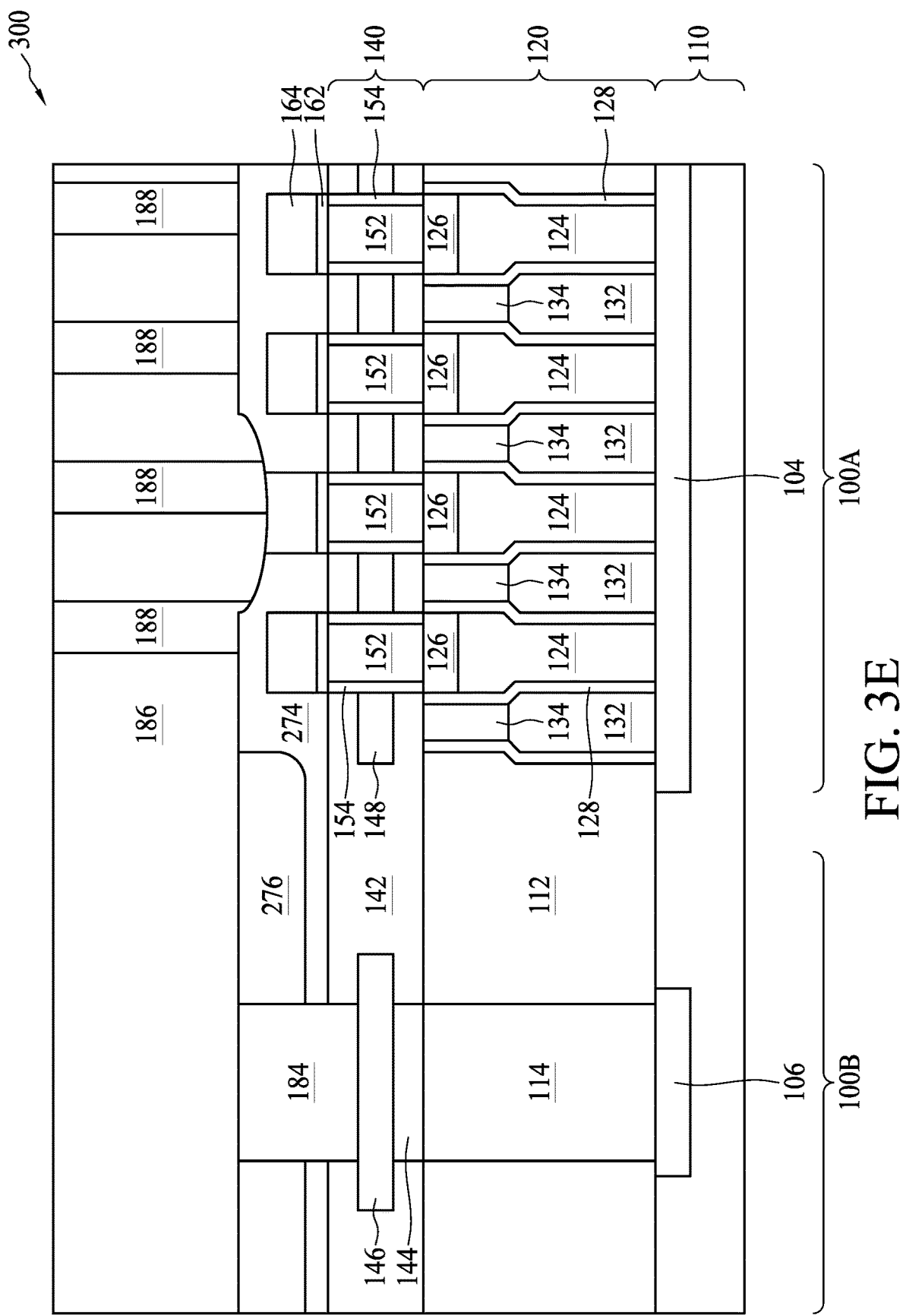
Figure 3F:
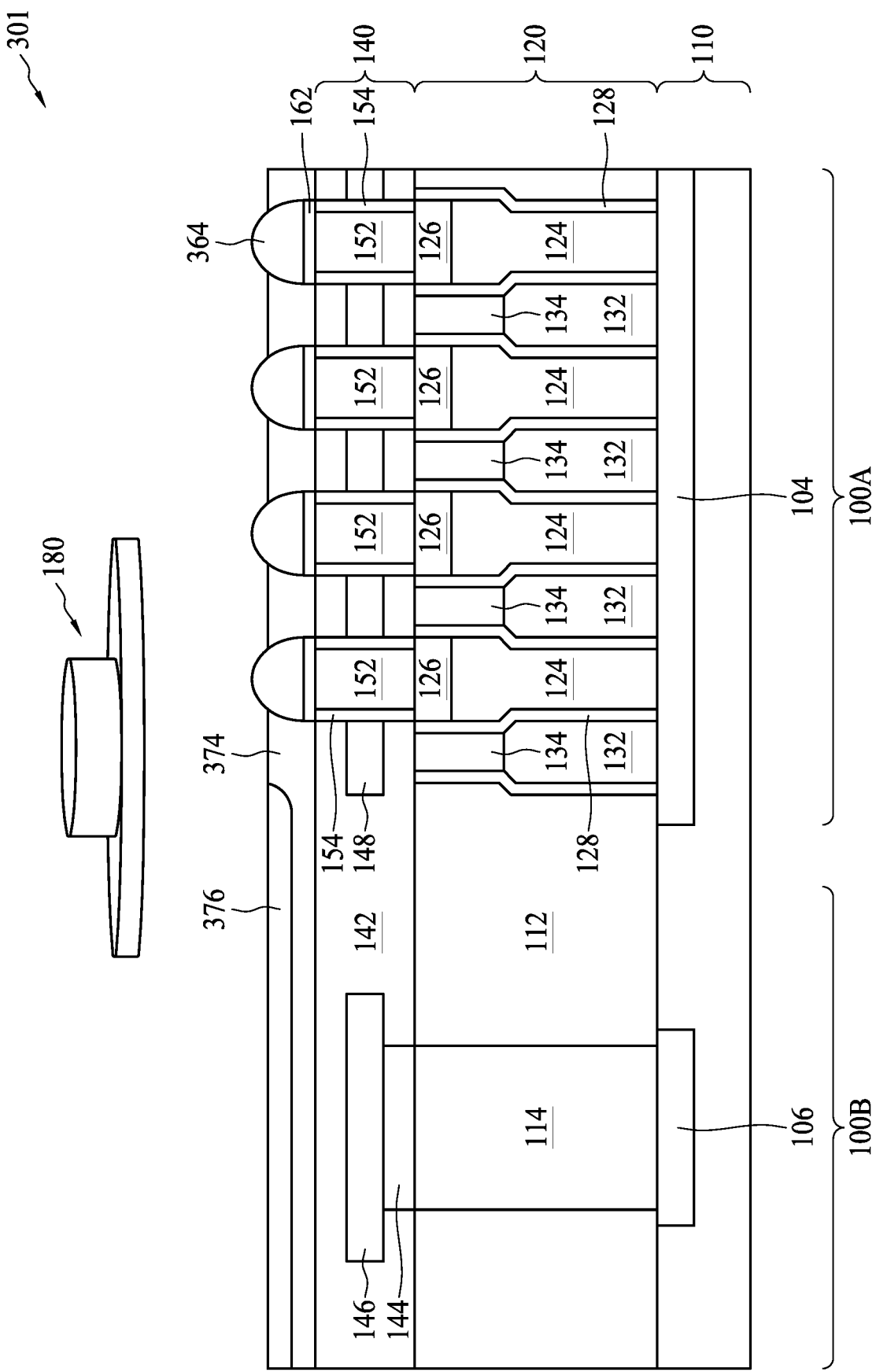

Referring to FIG. 3E, the dielectric layer 186 and the bit lines 188 are formed over the dielectric layer 174 and the conductive pads 164 in a manner similar to that described with reference to FIGS. 1X to 1AB. As can be seen in FIG. 3E, an open-circuit defect may be found between some of the bit lines 188 and the corresponding conductive pads 162 because of the residual portion of the dielectric layer 174 left on the conductive pads 164. Consequently, the problematic bit lines 188 may not function properly to electrically connect to the corresponding channel layers 152, and the reliability of the semiconductor structure 300 is compromised.

FIGS. 3A, 3B, 3C and 3F to 3G show a scenario of CMP over-polishing in a semiconductor structure 301, in accordance with some comparative embodiments of the present disclosure. The semiconductor structure 301 is formed as described with reference to FIGS. 3A, 3B and 3C, in a manner similar to the procedure forming the semiconductor structure 300. Subsequently, referring to FIG. 3F, after the planarization operation, e.g., CMP, performed by the tool 180, a problem of over-polishing may occur to the surface of the polished dielectric layer 174 and the conductive pads 162. The surface roughness of the polished surface of the dielectric layer 174 causes almost all of the conductive pads 164 being thinned into conductive pads 364 with reduced heights. According to some comparative embodiments of the present disclosure, the conductive pads 364 have rounded upper surfaces, thus the effective contact area of the conductive pads 364 may be reduced as compared to the conductive pads 164. In the meantime, the portions of the dielectric layer 174 between the conductive pads 364 are also over-etched. The thinned dielectric layer 174 between the adjacent conductive pads 364, that results from the over-polishing of the CMP operation, may further increase the likelihood of short-circuit defects between the adjacent conductive pads 364. The over-polishing of the CMP operation may occur not only to the dielectric layer 174 and the conductive pads 364 across different semiconductor wafers but also to the different portions of the dielectric layer 174 and the conductive pads 364 in the single semiconductor wafer. According to some comparative embodiments of the present disclosure, although not shown in FIG. 3F, some conductive pads 364 may be thinned below the upper surface of the dielectric layer 174. As a result, at least some of the conductive pads 364 cannot maintain sufficient height for subsequent electrical coupling after the planarization operation is performed.

Figure 3G:
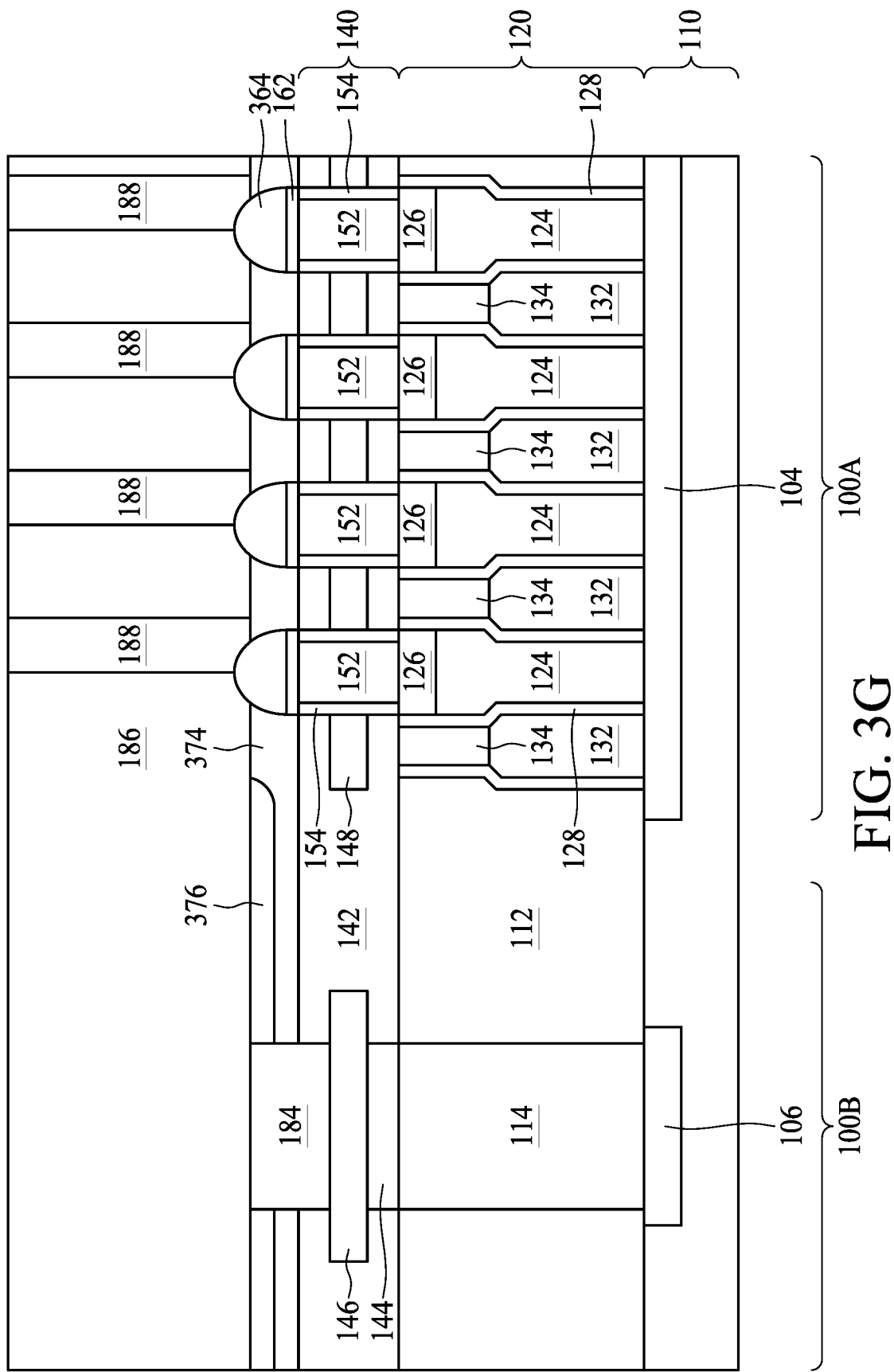

Referring to FIG. 3G, the dielectric layer 186 and the bit lines 188 are formed over the dielectric layer 174 and the conductive pads 364 in a manner similar to that described with reference to FIGS. 1X to 1AB. As can be seen in FIG. 3G, a high resistance or an open-circuit defect may be found at the interface between the bit lines 188 and the conductive pads 364 because of the reduced heights or the reduced contact areas of the upper portions of the conductive pads 364. Consequently, the problematic bit lines 188 or conductive pads 364 may not function properly to electrically couple the bit lines 188 to the channel layers 152, and the reliability of the semiconductor structure 301 is compromised.

Figure 4A:
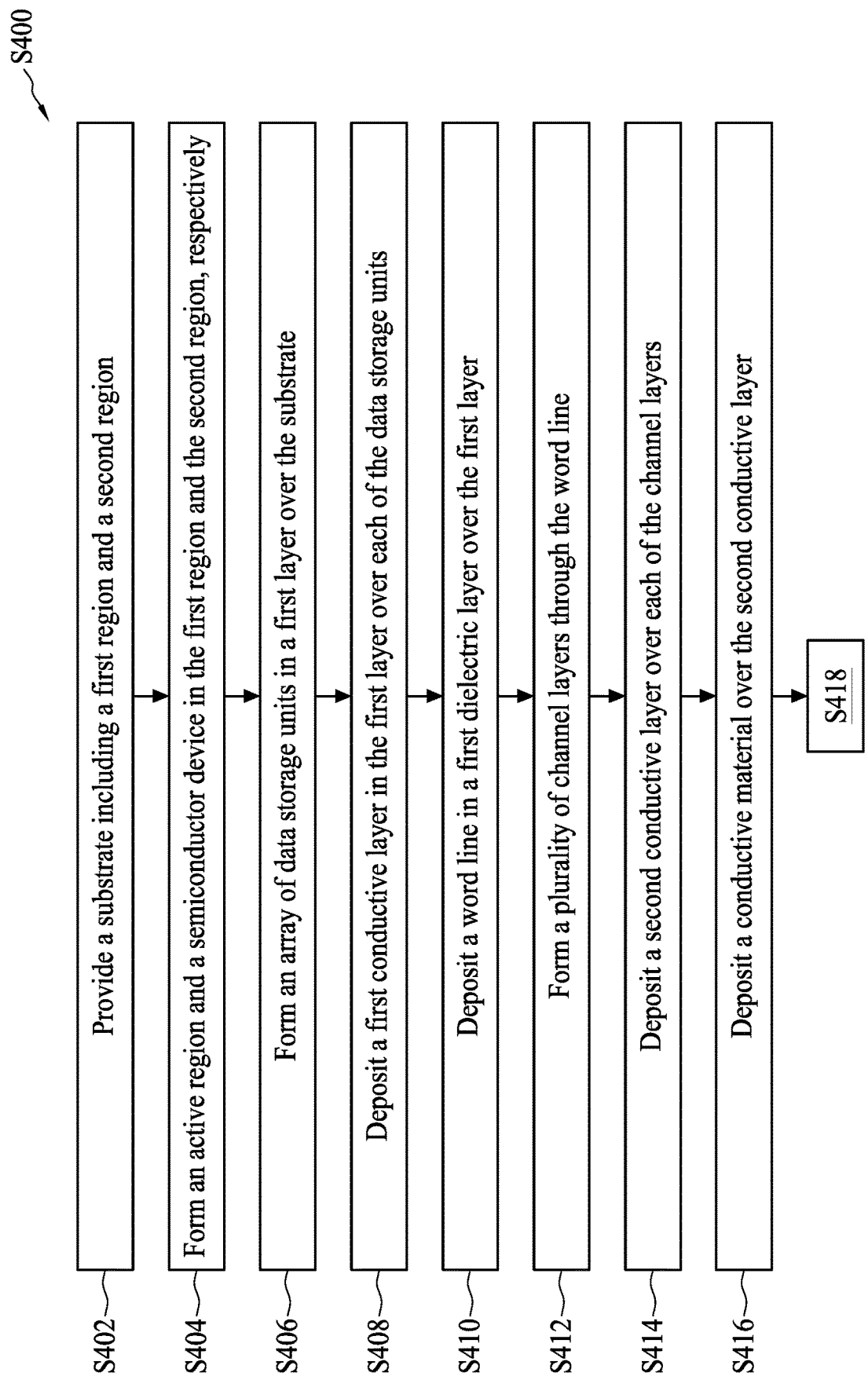
FIGS. 4A, 4B and 4C-show a schematic flowchart of a method of manufacturing a semiconductor structure, in accordance with some embodiments of the present disclosure.
Figure 4B:
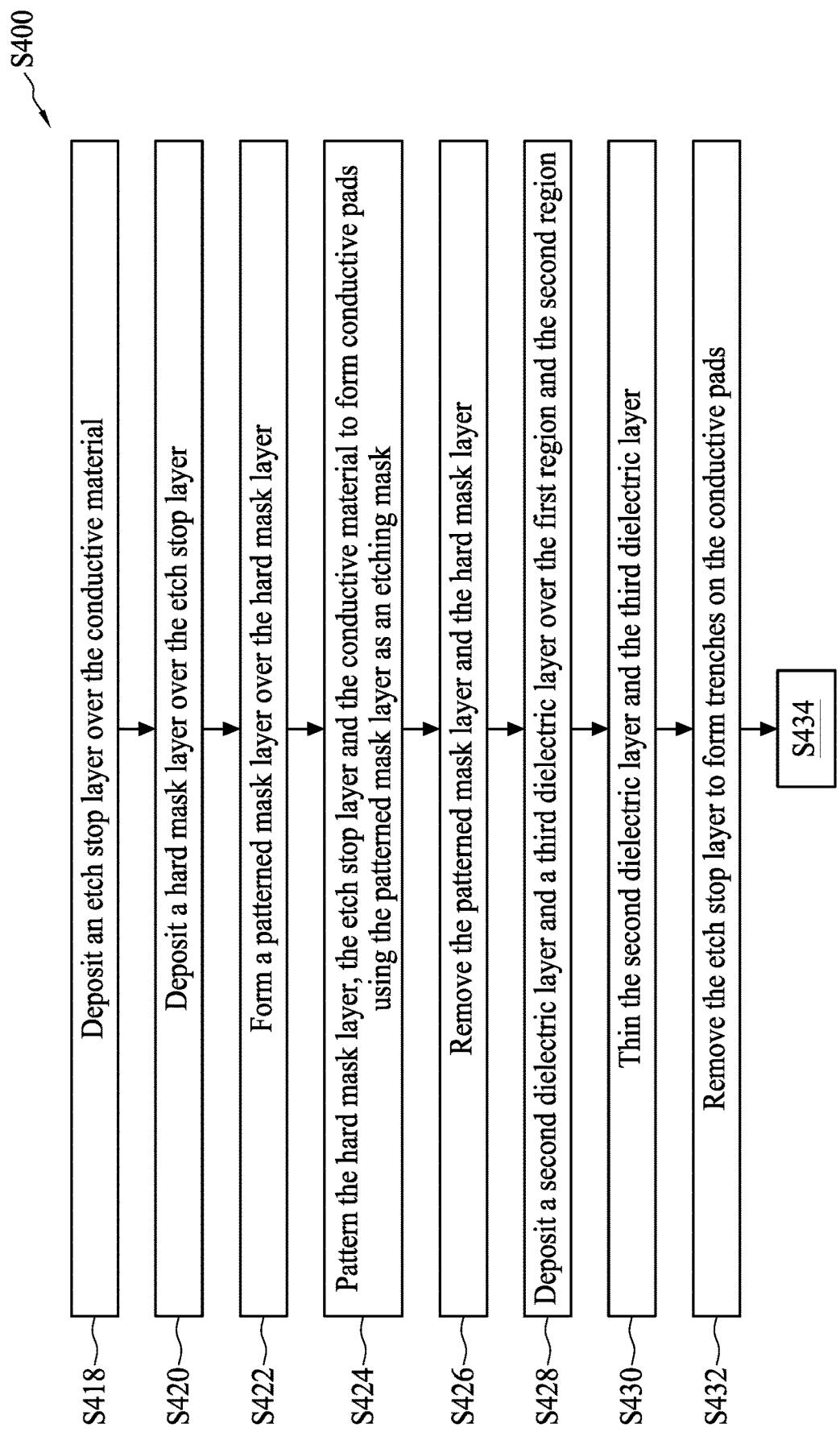
Figure 4C:
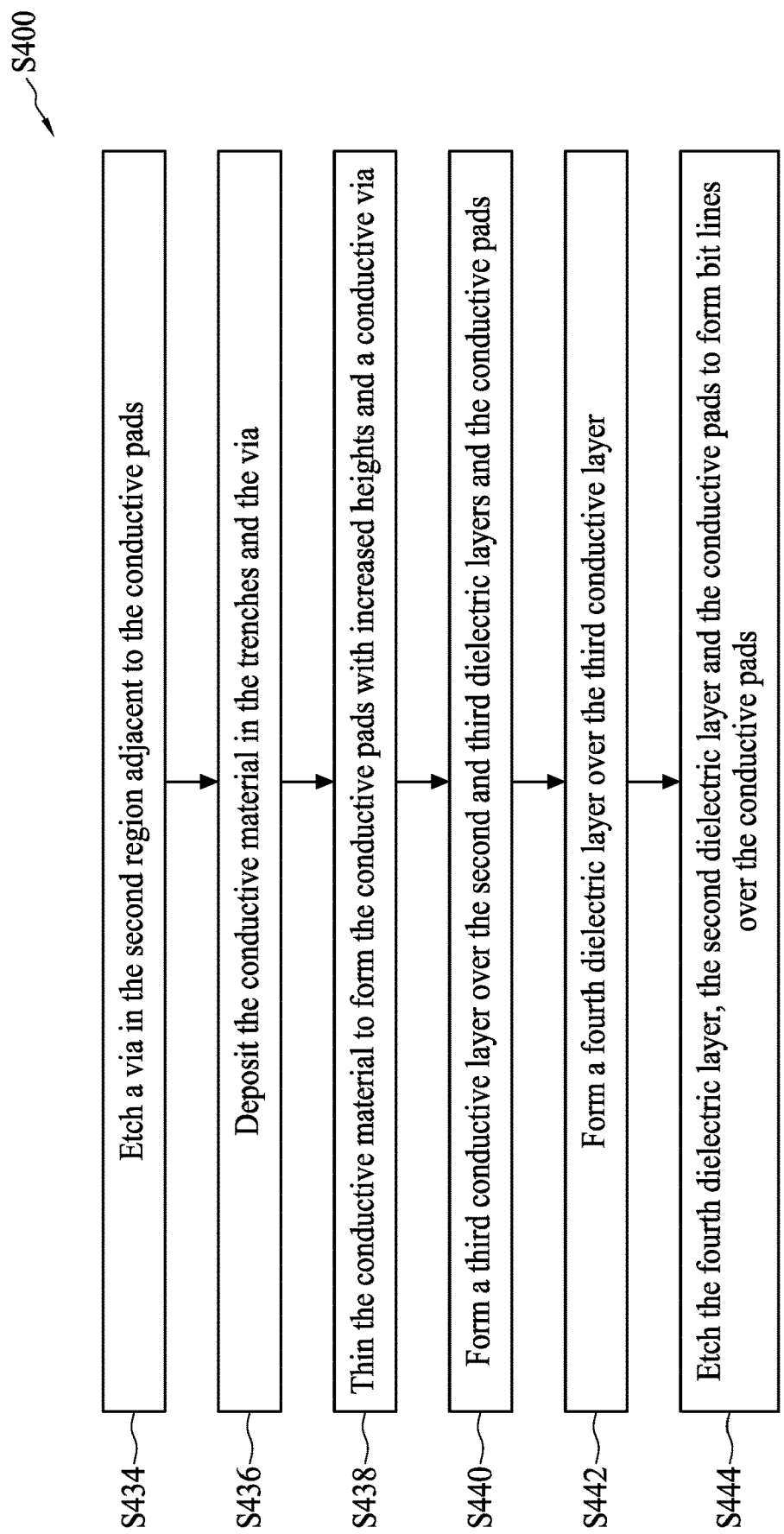

FIGS. 4A, 4B and 4C show a schematic flowchart of a method S400 of forming a semiconductor structure, in accordance with some embodiments of the present disclosure. It is understood that additional steps can be provided before, during, and after the steps shown by FIGS. 4A to 4C, and some of the steps described below can be replaced or eliminated in additional embodiments of the method S400. The steps may be performed independently, and the order of the steps may be interchangeable. The semiconductor structure described with reference to FIGS. 4A to 4C may be similar to the semiconductor structure 100.

Referring to FIG. 4A, at step S402, a substrate including a first region and a second region is provided. According to some embodiments of the present disclosure, the first region is a memory array region. According to some embodiments of the present disclosure, the second region is a peripheral region. The second region may be arranged adjacent to laterally surround the first region.

At step S404 an active region and a semiconductor device are formed in the first region and the second region, respectively. The active region may be similar to the active region 104, and the semiconductor device may be similar to the semiconductor device 106.

At step S406, an array of data storage units, e.g., the data storage unit 124, are formed in a first layer over the substrate. According to some embodiments of the present disclosure, each of the data storage units is formed of capacitors to store data information.

At step S408, a first conductive layer, e.g., the conductive oxide layer 126, is deposited in the first layer over each of the data storage units. The first conductive layer may include ITO, IWO, or other suitable conductive oxide material.

At step S410, a word line, e.g., the word line 148 is deposited in a first dielectric layer, e.g., the dielectric layer 142, over the first layer.

At step S412, a plurality of channel layers, e.g., the channel layer 152, are formed through the word line. According to some embodiments of the present disclosure, insulating films, e.g., the insulating films 154 are formed on the sidewalls of each of the channel layers. The channel layers are electrically coupled to the underlying first conductive layers.

At step S414, a second conductive layer, e.g., the conductive oxide layer 162, is deposited over each of the channel layers. The second conductive layer may include ITO, IWO, or other suitable conductive oxide material.

At step S416, a conductive material, e.g., the conductive material 163, is deposited over the second conductive layer. According to some embodiments of the present disclosure, the conductive material includes tungsten. According to some other embodiments of the present disclosure, the conductive material includes aluminum, silver, gold, titanium, titanium nitride, tantalum, tantalum nitride, alloys thereof, of the like.

Referring to FIG. 4B, at step S418, an etch stop layer, e.g., the etch stop layer 165, is deposited over the conductive material. The etch stop layer may include silicon nitride, silicon carbide, high-k dielectric materials or other suitable materials.

At step S420, a hard mask layer is deposited over the etch stop layer. According to some embodiments of the present disclosure, the hard mask layer is substantially formed of elementary carbon.

At step S422, a patterned mask layer, e.g., the pattern mask layer 170, is deposited over the hard mask layer. The patterned mask layer may include an under layer and a DARC. According to some embodiments of the present disclosure, the pattern mask layer 170 includes a pattern of a plurality of conductive pads or landing pads.

At step S424, the hard mask layer, the etch stop layer and the conductive material are patterned to form conductive pads, e.g., the conductive pads 164, using the patterned mask layer as an etching mask. According to some embodiments of the present disclosure, the etching operations for patterning the hard mask layer, the etch stop layer and the conductive material are performed subsequently or during a single etching operation.

At step S426, the patterned mask layer and the hard mask layer are removed. The removal of the patterned mask layer and the hard mask may include an etching operation, e.g., a dry etch, a wet etch, an RIE, or the like.

At step S428, a second dielectric layer, e.g., the dielectric layer 174, and a third dielectric layer, e.g., the dielectric layer 176, are deposited over the first region and the second region. According to some embodiments of the present disclosure, the second dielectric layer and the third dielectric layer are formed using different deposition methods, e.g., the second dielectric layer is formed using ALD, and the third dielectric layer is formed using CVD. The third dielectric layer covers the entire second dielectric layer.

At step S430, the second dielectric layer and the third dielectric layer are thinned. The thinning operation may include a CMP operation. According to some embodiments of the present disclosure, during the thinning operation, the second dielectric layer is leveled with the third electric layer. According to some embodiments of the present disclosure, during the thinning operation, the upper surfaces of the etch stop layer is leveled with the second dielectric layer.

At step S432, the etch stop layer are thinned to form trenches on the conductive pads. According to some embodiments of the present disclosure, during the thinning operation, the etch stop layer is removed from the upper surfaces of the conductive pads to expose the upper surfaces of the conductive pads. The thinning operation may be performed by a dry etch, a wet etch, an RIE or the like.

Referring to FIG. 4C, at step S434, a via, e.g., the via 176T, is etched in the second region adjacent to the conductive pads. The via 176T may extend through the second dielectric layer and the third dielectric layer and etches a thickness of the first dielectric layer.

At step S436, the conductive material is deposited in the trenches and the via. According to some embodiments of the present disclosure, the conductive material fills the trenches and the via and extends over the second dielectric layer and the third dielectric layer.

At step S438, the conductive material is thinned to form the conductive pads with increased heights and a conductive via in the via. According to some embodiments of the present disclosure, the thinning operation includes CMP or mechanical grinding.

At step S440, a third conductive layer, e.g., the conductive layer 185, is formed over the second dielectric layer, the third dielectric layer and the conductive pads. According to some embodiments of the present disclosure, the third conductive layer covers the second dielectric layer and the third dielectric layer, and the conductive pads.

At step S442, a fourth dielectric layer, e.g., the dielectric layer 186, is formed over the third conductive layer. According to some embodiments of the present disclosure, the fourth dielectric layer covers the third conductive layer.

At step S444, the fourth dielectric layer, the second dielectric layer and the conductive pads are etched to form bit lines, e.g., the bit lines 188, over the conductive pads. According to some embodiments of the present disclosure, the bit lines are electrically coupled to the data storage units through the conductive pads, the first conductive layer, the channel layer, and the second conductive layer.

The proposed planarization method for the memory cells provides advantages. Since the performance of the CMP, such as the surface roughness, is substantially proportional to the etched thickness of the CMP, the final surface uniformity may not meet the design requirement when the material layer, e.g., the conductive pad 164, that needs to be planarized has a relatively low thickness or height as compared to the etched heights of the material layers thinned by the CMP. The surface roughness may cause over-polishing defects in some of the conductive pads, while causing under-polishing defects in some other conductive pads at the same time. And such under-polishing and over-polishing may occur in a single semiconductor wafer.

Through the proposed etch stop layer, e.g., the etch stop layer 166, arranged over the conductive pads, the tolerance of the surface roughness of the CMP operation can be greatly increased. It is easier to allow the CMP grinding to stop at the etch stop layers without consuming the underlying conductive pads or otherwise leaving more dielectric residues on the conductive pads. Furthermore, the performance of the end-point detection scheme used during the CMP can be performed more effectively due to the presence of the etch stop layer. As a result, the process window of the planarization operation is enlarged, and the conductive pads can be deposited and planarized with high reliability and uniformity. The robustness and yield of the semiconductor memory structure can be further improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
a data storage unit in a first dielectric layer;
a word line disposed over the data storage unit;
an array of conductive pads disposed over the word line;
a hard mask layer disposed over the array of conductive pads; and
a second dielectric layer laterally surrounding the hard mask layer and the array of conductive pads, the second dielectric layer is leveled with the hard mask layer,
wherein the array of conductive pads form a pattern following a pattern of the hard mask layer.

2. The semiconductor structure of claim 1, further comprising an antireflection coating over the hard mask layer.

3. The semiconductor structure of claim 1, further comprising a third dielectric layer over the second dielectric layer.

4. The semiconductor structure of claim 3, wherein the third dielectric layer is leveled with the second dielectric layer.

5. The semiconductor structure of claim 3, wherein the second dielectric layer fills a space between the array of conductive pads.

6. The semiconductor structure of claim 3, further comprising a plurality of channel layers extending through the word line.

7. The semiconductor structure of claim 6, further comprising an insulating film disposed between the word line and the plurality of channel layers.

8. The semiconductor structure of claim 6, wherein the plurality of channel layers comprise conductive oxide.

9. The semiconductor structure of claim 6, further comprising a conductive layer electrically coupling the data storage unit to one of the plurality of channel layers, wherein the conductive layer comprises oxide.

* * * * *